(12) United States Patent
Zhang et al.

(10) Patent No.: US 12,339,645 B2
(45) Date of Patent: Jun. 24, 2025

(54) ESTIMATION OF CHAMBER COMPONENT CONDITIONS USING SUBSTRATE MEASUREMENTS

(71) Applicant: Applied Materials, Inc., Santa Clara, CA (US)

(72) Inventors: Chunlei Zhang, Santa Clara, CA (US); Zhaozhao Zhu, Milpitas, CA (US); Michael Kutney, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 416 days.

(21) Appl. No.: 17/882,393

(22) Filed: Aug. 5, 2022

(65) Prior Publication Data

US 2023/0236569 A1 Jul. 27, 2023

Related U.S. Application Data

(63) Continuation-in-part of application No. 17/584,318, filed on Jan. 25, 2022, now Pat. No. 12,216,455.

(51) Int. Cl.
*G05B 19/4099* (2006.01)
*G05B 19/418* (2006.01)
(Continued)

(52) U.S. Cl.
CPC ... *G05B 19/4099* (2013.01); *G05B 19/41875* (2013.01); *H01L 21/67253* (2013.01);
(Continued)

(58) Field of Classification Search
CPC .......... G05B 19/41835; G05B 19/4183; G05B 2219/45031; G05B 19/41875;
(Continued)

(56) References Cited

U.S. PATENT DOCUMENTS 5,238,354 A   8/1993   Volovich
5,427,878 A   6/1995   Corliss
(Continued)

FOREIGN PATENT DOCUMENTS

CN   305860013   6/2020
CN   306604020   6/2021
(Continued)

OTHER PUBLICATIONS

"Production-centric Yield Management for Wafer Manufacturing" Jan. 5, 2018, Synopisis, site visited Jan. 6, 2022: https://www.synopsys.com/content/dam/synopsys/silicon/datasheets/odyssey-ds.pdf (Year: 2018).
(Continued)

*Primary Examiner* — Ziaul Karim
(74) *Attorney, Agent, or Firm* — Lowenstein Sandler LLP

(57) ABSTRACT

A method includes processing a substrate in a process chamber according to a recipe, wherein the substrate comprises at least one of a film or a feature after the processing. The method further includes generating a profile map of the first substrate. The method further includes processing data from the profile map using a first model, wherein the first model outputs at least one of an estimated mesa condition of a substrate support for the process chamber, an estimated lift pin location condition of the substrate support an estimated seal band condition of the substrate support, or an estimated process kit ring condition for a process kit ring for the process chamber. The method further includes outputting a notice as a result of the processing.

24 Claims, 17 Drawing Sheets

(51) Int. Cl.
*H01L 21/67* (2006.01)
*H01L 21/68* (2006.01)
*H01L 21/687* (2006.01)

(52) U.S. Cl.
CPC .............. *G05B 2219/32368* (2013.01); *G05B 2219/45031* (2013.01); *H01L 21/67259* (2013.01); *H01L 21/681* (2013.01); *H01L 21/68714* (2013.01); *H01L 21/68742* (2013.01)

(58) Field of Classification Search
CPC .............. G05B 23/024; G05B 23/0283; H01L 21/67276; H01L 22/26; H01L 22/12; H01L 21/67253; H01L 21/67288
See application file for complete search history.

(56) References Cited

U.S. PATENT DOCUMENTS

| | | | |
|---|---|---|---|
| 5,452,521 A | 9/1995 | Niewmierzycki | |
| 6,162,008 A | 12/2000 | Perkins et al. | |
| 6,304,999 B1 | 10/2001 | Toprac et al. | |
| 6,625,497 B2 | 9/2003 | Fairbairn et al. | |
| 6,708,075 B2 | 3/2004 | Sonderman et al. | |
| D605,652 S | 12/2009 | Plaisted et al. | |
| 7,642,102 B2 | 1/2010 | Funk et al. | |
| D618,695 S | 6/2010 | Bennett et al. | |
| 7,904,275 B2 | 3/2011 | Sugimoto | |
| 8,072,578 B2 | 12/2011 | Yasuda et al. | |
| 8,179,530 B2 | 5/2012 | Levy et al. | |
| 8,257,546 B2 | 9/2012 | Davis et al. | |
| D756,371 S | 5/2016 | Bertnick et al. | |
| 9,347,879 B2 | 5/2016 | Adel et al. | |
| D766,940 S | 9/2016 | Napper et al. | |
| D767,612 S | 9/2016 | Hemsley | |
| D781,300 S | 3/2017 | Rhodes et al. | |
| D819,066 S | 5/2018 | Anderson et al. | |
| D829,749 S | 10/2018 | Kang et al. | |
| 10,262,910 B2 | 4/2019 | Feng et al. | |
| 10,388,549 B2 | 8/2019 | Paul et al. | |
| 10,490,462 B2 | 11/2019 | Pandev et al. | |
| D874,481 S | 2/2020 | Kumar et al. | |
| D884,015 S | 5/2020 | Walfridsson et al. | |
| D890,799 S | 7/2020 | Heffernan et al. | |
| 10,727,057 B2 | 7/2020 | Clark et al. | |
| 10,727,142 B2 | 7/2020 | Gellineau et al. | |
| D892,143 S | 8/2020 | Dascola et al. | |
| 10,886,155 B2 | 1/2021 | Zhu et al. | |
| D914,703 S | 3/2021 | Capela et al. | |
| 11,029,673 B2 | 6/2021 | Honda et al. | |
| D928,818 S | 8/2021 | Yuk et al. | |
| D937,861 S | 12/2021 | Torrance | |
| D938,465 S | 12/2021 | Shen et al. | |
| D940,169 S | 1/2022 | Boutros et al. | |
| D941,851 S | 1/2022 | Anderson et al. | |
| D948,543 S | 4/2022 | Friedland et al. | |
| 2002/0018217 A1 | 2/2002 | Weber-Grabau et al. | |
| 2003/0020889 A1 | 1/2003 | Takahashi | |
| 2005/0041255 A1 | 2/2005 | Hyun et al. | |
| 2005/0187649 A1 | 8/2005 | Funk et al. | |
| 2007/0134829 A1 | 6/2007 | Wilke et al. | |
| 2008/0013089 A1 | 1/2008 | Ishii et al. | |
| 2009/0132078 A1 | 5/2009 | Sakano | |
| 2010/0332011 A1 | 12/2010 | Venugopal et al. | |
| 2011/0172952 A1 | 7/2011 | Ummethala et al. | |
| 2011/0232569 A1 | 9/2011 | Olgado | |
| 2012/0285621 A1 | 11/2012 | Tan | |
| 2013/0059403 A1 | 3/2013 | Lee et al. | |
| 2015/0004721 A1 | 1/2015 | Akimoto et al. | |
| 2015/0132539 A1* | 5/2015 | Bailey | C23C 28/042 427/523 |
| 2016/0077025 A1 | 3/2016 | Zhang et al. | |
| 2016/0313658 A1 | 10/2016 | Marciano et al. | |
| 2016/0341544 A1 | 11/2016 | Foad | |
| 2016/0345384 A1* | 11/2016 | Zhang | H01L 21/67248 |
| 2017/0038201 A1* | 2/2017 | Bozdog | G01N 23/2273 |
| 2017/0053819 A1* | 2/2017 | Richardson | H01J 37/3244 |
| 2017/0213750 A1 | 7/2017 | Khaja et al. | |
| 2018/0150052 A1 | 5/2018 | Cherian | |
| 2019/0064751 A1 | 2/2019 | Ohmori et al. | |
| 2019/0121928 A1 | 4/2019 | Wu et al. | |
| 2019/0147127 A1 | 5/2019 | Su et al. | |
| 2019/0286075 A1 | 9/2019 | Yennie et al. | |
| 2019/0347527 A1 | 11/2019 | Bhaviripudi et al. | |
| 2020/0050180 A1 | 2/2020 | Kou et al. | |
| 2020/0069595 A1* | 3/2020 | Neshat | A61K 9/0063 |
| 2020/0083070 A1 | 3/2020 | Clark et al. | |
| 2020/0083080 A1* | 3/2020 | Clark | H01L 21/76834 |
| 2020/0110341 A1 | 4/2020 | Mossavat et al. | |
| 2020/0110390 A1* | 4/2020 | Banna | H01L 21/67155 |
| 2020/0243359 A1* | 7/2020 | Hao | H01J 37/32935 |
| 2020/0294836 A1* | 9/2020 | Criminale | H01L 22/20 |
| 2021/0166121 A1* | 6/2021 | Tsutsui | G06N 3/04 |
| 2022/0005713 A1 | 1/2022 | Lu et al. | |
| 2022/0026817 A1 | 1/2022 | Ummethala et al. | |
| 2022/0028716 A1 | 1/2022 | Ummethala et al. | |
| 2022/0066411 A1 | 3/2022 | Ummethala et al. | |
| 2022/0111529 A1 | 4/2022 | Pehlivan et al. | |
| 2022/0165593 A1 | 5/2022 | Panda et al. | |

FOREIGN PATENT DOCUMENTS

| | | |
|---|---|---|
| EP | 1959489 A2 | 8/2008 |
| JP | 2006157029 A | 6/2006 |
| JP | 2018037559 A | 3/2018 |
| JP | D1644619 S | 11/2019 |
| JP | 2020004817 A | 1/2020 |
| JP | D1651220 S | 1/2020 |
| JP | D1659894 S | 5/2020 |
| JP | D1664109 S | 7/2020 |
| KR | 101910268 B1 | 10/2018 |
| WO | 0229393 A1 | 4/2002 |
| WO | 2012099907 A1 | 7/2012 |
| WO | 2019200015 A1 | 10/2019 |
| WO | 2020094325 A1 | 5/2020 |
| WO | 2021021501 A1 | 2/2021 |
| WO | 2021067239 A1 | 4/2021 |
| WO | 2021061541 A1 | 4/2022 |

OTHER PUBLICATIONS

Ronald L. Allen et al., "Application of neural networks to plasma etch end point detection", Journal of Vacuum Science & Technology B: Microelectronics and Nanometer Structures Processing, Measurement, and Phenomena 14, 498 (1996), pp. 498-503.
PCT International Search Report and Written Opinion for International Application No. PCT/US2021/042646 mailed Nov. 2, 2021, 10 pages.
PCT International Search Report and Written Opinion for International Application No. PCT/US2021/042639 mailed Nov. 11, 2021, 10 pages.
PCT International Search Report and Written Opinion for International Application No. PCT/US2021/042643 mailed Nov. 11, 2021, 9 pages.
PCT International Search Report and Written Opinion for International Application No. PCT/US2021/048061 mailed Dec. 17, 2021, 9 pages.
Taiwan Search report of Taiwan Application No. 110300382 dated Sep. 27, 2021, 7 pages.
International Search Report and Written Opinion mailed on Apr. 12, 2023, on Application No. PCT/US2022/051285.

* cited by examiner

ESTIMATION OF CHAMBER COMPONENT CONDITIONS USING SUBSTRATE MEASUREMENTS

RELATED APPLICATIONS

This application is a continuation-in-part (CIP) of U.S. patent application Ser. No. 17/584,318, filed Jan. 25, 2022, which is incorporated by reference herein in its entirety.

TECHNICAL FIELD

Embodiments of the present disclosure relate, in general, to detecting conditions of chamber components in a processing chamber, and in particular to generating a map and/or numerical profiling of a substrate processed using a chamber and estimating conditions of one or more chamber components of the chamber based on the map and/or numerical profiling of the substrate.

BACKGROUND

Substrate processing may include a series of processes that produce electrical circuits in a semiconductor in accordance with a circuit design. These processes may be carried out in a series of process chambers. Successful operation of a modern semiconductor fabrication facility may aim to facilitate a steady stream of wafers to be moved from one chamber to another in the course of forming electrical circuits in the wafer to form a product. In the process of performing many substrate processes, conditions of processing chambers may be altered and may result in a processed substrate failing to meet target conditions and outcomes.

Process chambers include many chamber components. Over time the chamber components of process chambers wear out and/or become damaged, which can result in degradation in quality of product produced using the process chambers and/or scrapping of substrates processed using the process chambers.

Additionally, new components may not be in compliance with specifications.

SUMMARY

The following is a simplified summary of the disclosure in order to provide a basic understanding of some aspects of the disclosure. This summary is not an extensive overview of the disclosure. It is intended to neither identify key or critical elements of the disclosure, nor delineate any scope of the particular implementations of the disclosure or any scope of the claims. Its sole purpose is to present some concepts of the disclosure in a simplified form as a prelude to the more detailed description that is presented later.

In an exemplary embodiment, a method includes processing a first substrate in a process chamber of a substrate processing system according to a recipe, wherein the first substrate comprises at least one of a film or a feature after the processing. The method further includes generating a profile map of at least one of the film or the feature on the first substrate using a substrate measurement system of the substrate processing system. The method further includes processing data from the profile map using a first model, wherein the first model outputs at least one of an estimated mesa condition of a substrate support for the process chamber, an estimated lift pin location condition of the substrate support an estimated seal band condition of the substrate support, or an estimated process kit ring condition for a process kit ring for the process chamber. The method further includes outputting a notice of at least one of the estimated mesa condition, the estimated lift pin location condition, the estimated process kit ring condition, or the estimated seal band condition of the substrate support as a result of the processing.

In an exemplary embodiment, a computer readable medium comprises instructions that, when executed by a processing device, cause the processing device to perform operations. The operations include receiving a profile map of at least one of a film or a feature on a first substrate that was measured using a substrate measurement system after the first substrate was processed in a process chamber. The operations further include processing data from the profile map using a first trained machine learning model, wherein the first trained machine learning model outputs at least one of an estimated mesa condition of a substrate support for the process chamber, an estimated lift pin location condition of the substrate support an estimated seal band condition of the substrate support, or an estimated process kit ring condition for a process kit ring for the process chamber. The operations further include outputting a notice of at least one of the estimated mesa condition, the estimated lift pin location condition, the estimated process kit ring condition, or the estimated seal band condition of the substrate support as a result of the processing.

In an exemplary embodiment, a computer readable medium comprising instructions that, when executed by a processing device, cause the processing device to perform operations. The operations include receiving a first profile map of at least one of a film or a feature on a first substrate, the first profile map having been generated by a substrate measurement system after the first substrate was processed by a process chamber according to a recipe at a first time. The operations further include receiving a second profile map of at least one of a film or a feature on a second substrate, the second profile map having been generated by the substrate measurement system after the second substrate was processed by the process chamber according to the recipe at a second time. The operations further include comparing the second profile map to the first profile map. The operations further include determining, based on a result of the comparing, at least one of a) an estimated mesa condition for one or more mesas of a substrate support in the process chamber, b) an estimated lift pin location condition of one or more lift pins of the substrate support, or c) an estimated seal band condition of a seal band of the substrate support.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Figure 1:
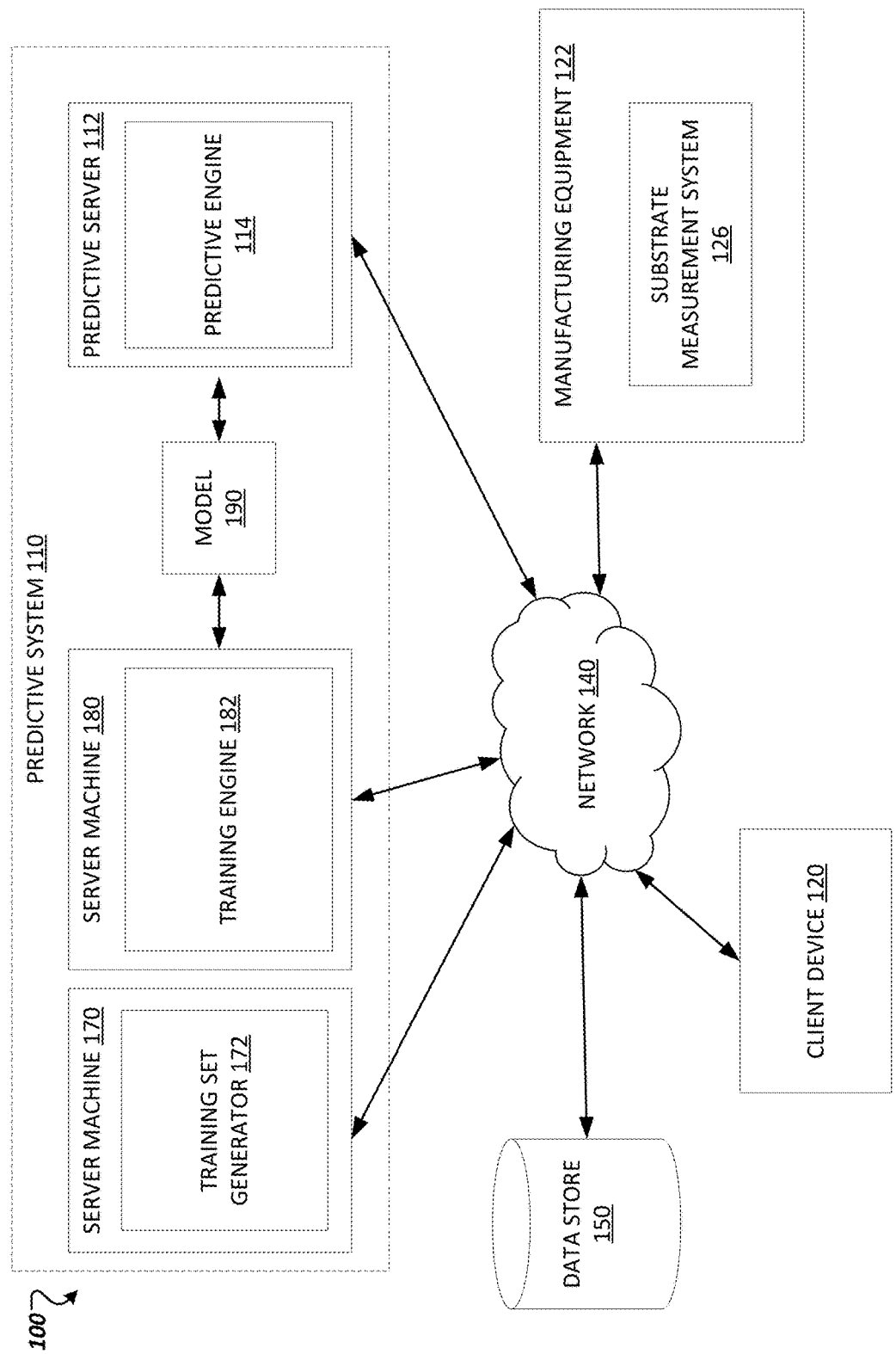
FIG. 1 depicts an illustrative computer system architecture, according to aspects of the present disclosure.

Embodiments of the present disclosure are directed to a system and method for assessing the condition of one or more chamber components in a process chamber, such as a process chamber for semiconductor processing. Process results of manufacturing processes depend on many factors, including process recipe, tool parameter settings (e.g., including chamber parameter settings and settings for parameters of one or more tools external to a chamber) and chamber component conditions. For example, process results may vary across the surface of a substrate based on a condition of a showerhead, a condition of a substrate support that supports the substrate, a condition of a chamber liner, conditions of pumps and/or valves, and so on. For example, any changes to a substrate support such as an electrostatic chuck, a clamp, a vacuum chuck, a heater, a support that includes a pocket with a lip on an edge of the support, and/or substrate support that includes one or more embedded features (e.g., such as a heater, cooling plate, electrical elements, etc.) and so on over time will slowly impact substrate results, such as through temperature change across a surface of a processed substrate. Changes in the substrate support (e.g., a chuck) may additionally or alternatively negatively impact chucking and/or dechucking of substrates, lift pin regions of substrates, seal band regions at a periphery of substrates, and so on. Embodiments provide new mechanisms for assessing the condition of chamber components. Embodiments can be used to illustrate a slow change or degradation of a substrate support and/or other chamber components over time, for example. Embodiments can be used to determine whether a chamber component such as a process kit ring was installed correctly after a maintenance event or upon new installation and/or to determine how the chamber component was installed (e.g., a placement of the chamber component). Embodiments can be used to perform quality assessments of process chambers. The information from assessment of chamber components may be used to determine whether to adjust one or more settings for a process chamber, whether to adjust process recipes, whether and/or when to perform maintenance on the process chamber (e.g., by refurbishing and/or replacing one or more chamber components of the process chamber), and so on.

In embodiments, a process is performed in a process chamber to deposit or etch a film, layer and/or one or more features (e.g., measureable features) on a surface of a substrate. The substrate may be a bare substrate or a test substrate that does not include product. Alternatively, the substrate may be a product substrate. The film may be a blanket film deposited over a surface of the substrate. The film may be a stack of multiple layers, which may be patterned or unpatterned layers. In some embodiments, a film includes a stack of patterned layers having features such as trenches, structures, devices, and so on. Such features may include or have critical dimensions (e.g., width of trench at one or more depths of the trench) that can be measured in embodiments. Measured features may include features distributed across a surface of the substrate. Features may include, for example, mesas, dots, structures, valleys, walls, lines, grooves, fiducials, critical dimensions, and so on. In one embodiment, the film is a polymer film and/or the feature(s) are polymer feature(s).

After the film and/or feature has been deposited or etched on the substrate, the substrate may be removed from the process chamber and input into a substrate measurement system. The substrate measurement system may be, for example, a reflectometry system or other measurement system that measures a film thickness of the film and/or feature(s) at multiple locations of the substrate. The thickness information and/or feature information may be used to generate a thickness profile map for the substrate. Alternatively, one or more other profile map (e.g., of optical constants, or roughness, of particle counts, etc.) of the substrate may be generated from other measurement data. In an example, if the substrate includes a stack of patterned layers, then the profile map may include a critical dimensions profile map. The film and/or feature thickness information (e.g., thickness profile map) or other film and/or feature information (e.g., other profile maps such as an optical constant profile map, a particle count profile map, critical dimensions profile map, etc.) may then be processed using a model (e.g., a trained machine learning model, a physics-based model, a statistical model, etc.) and/or image processing to identify variations in the film property or properties and to determine information about one or more chamber components of the process chamber based on the identified property variations (e.g., such as film thickness variations, critical dimensions variations, etc.). Embodiments are discussed with reference to measuring a film on a substrate. However, it should be understood that the embodiments also apply to measuring one or more features (e.g., critical dimensions) on a substrate in addition to or instead of measuring a film on the substrate.

If a product substrate (e.g., a product wafer) is measured to determine the profile map of the substrate, then measurements may be performed of product substrates frequently, as the process chamber up time (time during which the process chamber is used to process product) is not impacted by frequent measurements. Alternatively, if a test substrate is processed and measured to determine the profile map of the test substrate, then measurements may be performed less frequently since product generally is not processed during processing of a test substrate, resulting in decreased chamber up time.

In one example, a substrate support surface includes many features that accommodate substrate chucking and dechucking (or clamping and unclamping), temperature control, backside helium control, and lift pin control. Features of the substrate support may include, for example, a series of mesas and/or channels on an upper surface of the substrate support that support a substrate while providing an area that can be filled with a thermally conductive gas such as helium during processing to facilitate thermal contact between a supported substrate and the substrate support. Features of the substrate support may further include a seal band around a periphery of the upper surface of the substrate support that seals in the thermally conductive gas in the region between the underside of the substrate and the upper surface of the substrate support. Features of the substrate support may further include lift pin holes that accommodate lift pins that lift a substrate onto or off of the substrate support and seal bands around the lift pin holes. Features of the substrate support may further include a dielectric layer across the surface of the substrate support. Features of the substrate support may further include a bond between components of the substrate support (e.g., between a ceramic puck and a cooling plate or between ceramic plates of an electrostatic chuck). Due to use of the substrate support in a process chamber, one or more of the surface features of the substrate support may start to wear, may break, or may fail. Additionally, a bond may fail, causing delamination between layers or bodies of an substrate support. In another example, recesses or valleys in a surface of a substrate support, a planarity of a surface of the substrate support, a roughness across a surface of the substrate support, a concentricity of one or more circular features of the substrate support, etc. may effect a substrate processed while supported by the substrate support. Embodiments provide a mechanism for detecting erosion and/or degradation of the various features of the substrate support and/or for detecting one or more properties of the substrate support (e.g., such as surface roughness, concentricity of circular elements, recesses or grooves, planarity, etc.) without adding any additional measurement devices into the process chamber that houses the substrate support. Additionally, embodiments may identify erosion of a process kit ring around a substrate support, and may be used to determine whether and/or when to replace a process kit ring.

In embodiments, the system and method described herein can also be used to assess conditions of chamber components other than a substrate support. For example, the system and method may be used to assess the conditions of one or more features of other chamber components, such as hole diameters of gas delivery holes of a showerhead, estimated gas delivery (e.g., flow rates and/or total delivered gases) for each of a plurality of regions of a gas-distribution device (e.g., gas-distribution plate or showerhead), protective layer coating erosion on a surface of a gas-distribution device, gas or plasma delivery rates from different portions of a gas-distribution device, erosion of a process kit ring, and so on. The conditions of many other types of chamber components may also be assessed in accordance with embodiments of the present disclosure. Conditions of chamber components may be used to perform diagnostics of a process chamber, to improve a design of one or more components of a process chamber, to determine when to perform maintenance on and/or replace one or more components of a process chamber, and so on.

In some embodiments, the methods and systems discussed herein may be used to detect drift, wear and/or erosion of chamber components over time. Additionally, the methods and systems may be used to assess whether new components meet specifications. In an example, when parts are switched during a planned maintenance, a new part can be qualified by running a test with the process described herein to qualify this part as within a specified value.

Accordingly, embodiments add new detection capabilities to process chambers without any increased cost for those process chambers. These new detection capabilities can be leveraged in embodiments to predict reduced productivity, reduced product quality, increases in an amount of scrapped product, part failure, deficiencies in chamber component design, and so on. These new detection capabilities may further be used in embodiments to determine when to perform maintenance on one or more chamber components of process chambers, resulting in reduced unplanned downtime, reduced scrapping of product, reduced chamber failures, and so on. These new detection capabilities may further be used in embodiments to adjust one or more process recipes, adjust settings and/or positions of one or more chamber components, perform closed loop control of processes, and so on.

FIG. 1 depicts an illustrative computer system architecture 100, according to aspects of the present disclosure. Computer system architecture 100 includes a client device 120, manufacturing equipment 122, substrate measurement system 126, a predictive server 112 (e.g., to generate predictive data, to provide model adaptation, to use a knowledge base, etc.), and a data store 150. The predictive server 112 can be part of a predictive system 110. The predictive system 110 can further include server machines 170 and 180. In some embodiments, computer system architecture 100 can include or be a part of a manufacturing system for processing substrates, such as manufacturing system 200 of FIG. 2A. In additional or alternative embodiments, computer system architecture 100 can include or be a part of a chamber component condition prediction system (e.g., that assesses conditions of one or more chamber components in a process chambers). Further details regarding the chamber component condition prediction system are provided with respect to FIGS. 3-4.

Components of the client device 120, manufacturing equipment 122, substrate measurement system 126, predictive system 110, and/or data store 150 can be coupled to each other via a network 140. In some embodiments, network 140 is a public network that provides client device 120 with access to predictive server 112, data store 150, and other publicly available computing devices. In some embodiments, network 140 is a private network that provides client device 120 access to manufacturing equipment 122, substrate measurement system 126, data store 150, and/or other privately available computing devices. Network 140 can include one or more wide area networks (WANs), local area networks (LANs), wired networks (e.g., Ethernet network), wireless networks (e.g., an 802.11 network or a Wi-Fi network), cellular networks (e.g., a Long Term Evolution (LTE) network), routers, hubs, switches, server computers, cloud computing networks, and/or a combination thereof.

The client device 120 can include a computing device such as personal computers (PCs), laptops, mobile phones, smart phones, tablet computers, netbook computers, network connected televisions ("smart TVs"), network-connected media players (e.g., Blu-ray player), a set-top box, over-the-top (OTT) streaming devices, operator boxes, etc.

Manufacturing equipment 122 can produce products following a recipe. In some embodiments, manufacturing equipment 122 can include or be a part of a manufacturing system that includes one or more stations (e.g., process chambers, transfer chamber, load lock, factory interface, etc.) configured to perform different operations for a substrate.

Substrate measurement system 126 may be a component of a manufacturing system that can be used to measure substrates before and/or after those substrates are processed in one or more process chambers. The substrate measurement system 126 may be configured to generate optical emission spectroscopy data, reflectometry data, and/or other metrology data. The substrate measurement system 126 can include one or more components configured to collect and/or generate measurement data associated with one or more portions of a profile of a surface of a substrate after the substrate has been removed from a process chamber.

In some embodiments, substrate measurement system 126 can be configured to generate metrology data associated with substrates processed by other manufacturing equipment 122. The metrology data can include a value of one or more of film property data (e.g., wafer spatial film properties such as thickness), dimensions (e.g., thickness, height, etc.), dielectric constant, dopant concentration, density, defects, etc. The metrology data can be of a finished or semi-finished product, or of a test substrate such as a blanket wafer. Some embodiments are discussed with reference to use of reflectometry data and thickness profile maps to determine conditions of chamber components. However, it should be understood that the principles and embodiments set forth herein in association with reflectometry data and thickness profile maps also applies to other type of metrology data. For example, measurements may be made of particle counts, of optical constants for coatings, of surface roughness of coatings, of material compositions of coatings, and so on. Such measurements may be made for many regions on a substrate, and may be used to generate profile maps of particle counts, of optical constants, of surface roughness, of material composition, and so on across a measured substrate.

Substrate measurement system 126 can be configured to generate metrology data associated with a substrate before or after a substrate process. Substrate measurement system 126 can be integrated with a station of the manufacturing system that includes manufacturing equipment 122. In some embodiments, substrate measurement system 126 can be coupled to or be a part of a station of the process tool that is maintained under a vacuum environment (e.g., a process chamber, a transfer chamber, etc.). Such substrate measurement system 126 may be referred to as on-board metrology equipment. Accordingly, the substrate can be measured by the substrate measurement system 126 while the substrate is in the vacuum environment. For example, the substrate measurement system may be attached to a transfer chamber that is maintained under vacuum. For example, after a substrate process (e.g., an etch process, a deposition process, etc.) is performed for the substrate, the metrology data for the processed substrate can be generated by substrate measurement system 126 without the processed substrate being removed from the vacuum environment. Such substrate measurement system 126 may be referred to as on-board metrology equipment. In other or similar embodiments, substrate measurement system 126 can be coupled to or be a part of a manufacturing system that is not maintained under a vacuum environment (e.g., a factory interface module, etc.). In some embodiments, the substrate measurement system is attached to process chambers or tool clusters that are not maintained under vacuum, such as chemical mechanical polishing (CMP) process chambers.

Alternatively to substrate measurement system 126 being included in a manufacturing system (e.g., attached to a factory interface or transfer chamber), substrate measurement system 126 may be a device that is separate from (i.e., external to) manufacturing equipment 122. For example, substrate measurement system 126 can be standalone equipment that is not coupled to any station of manufacturing equipment 122. For a measurement to be obtained for a substrate using a detached substrate measurement system 126, a user of a manufacturing system (e.g., an engineer, an operator) can cause a substrate processed at manufacturing equipment 122 to be removed from manufacturing equipment 122 and transferred to substrate measurement system 126 for measurement. In some embodiments, substrate measurement system 126 can transfer metrology data generated for the substrate to the client device 120 coupled to substrate measurement system 126 via network 140 (e.g., for presentation to a manufacturing user, such as an operator or an engineer). In other or similar embodiments, the manufacturing system user can obtain metrology data for the substrate from substrate measurement system 126 and can provide the metrology data to computer system architecture via a graphical user interface (GUI) of client device 120.

Data store 150 can be a memory (e.g., random access memory), a drive (e.g., a hard drive, a flash drive), a database system, or another type of component or device capable of storing data. Data store 150 can include multiple storage components (e.g., multiple drives or multiple databases) that can span multiple computing devices (e.g., multiple server computers). The data store 150 can store profile maps (e.g., as generated from reflectometry data, from spectra data, etc.) such as film thickness profile maps and/or other substrate profile maps. Film thickness profile maps and/or other substrate profile maps can include historical maps and/or current maps.

One or more portions of data store 150 can be configured to store data that is not accessible to a user of the manufacturing system. In some embodiments, all data stored at data store 150 can be inaccessible by the manufacturing system user. In other or similar embodiments, a portion of data stored at data store 150 is inaccessible by the user while another portion of data stored at data store 150 is accessible to the user. In some embodiments, inaccessible data stored at data store 150 is encrypted using an encryption mechanism that is unknown to the user (e.g., data is encrypted using a private encryption key). In other or similar embodiments, data store 150 can include multiple data stores where data that is inaccessible to the user is stored in a first data store and data that is accessible to the user is stored in a second data store.

In some embodiments, predictive system 110 includes server machine 170 and server machine 180. Server machine 170 includes a training set generator 172 that is capable of generating training data sets (e.g., a set of data inputs and a set of target outputs) to train, validate, and/or test a machine learning model 190 or set of machine learning models 190. Some operations of training set generator 172 are described in detail below with respect to FIG. 5. In some embodiments, the training set generator 172 can partition the training data into a training set, a validating set, and a testing set.

Server machine 180 can include a training engine 182. An engine can refer to hardware (e.g., circuitry, dedicated logic, programmable logic, microcode, processing device, etc.), software (such as instructions run on a processing device, a general purpose computer system, or a dedicated machine), firmware, microcode, or a combination thereof. Training engine 182 can be capable of training a machine learning model 190 or a set of machine learning models 190. The machine learning model 190 can refer to the model artifact that is created by the training engine 182 using the training data that includes training inputs and corresponding target outputs (correct answers for respective training inputs). The training engine 182 can find patterns in the training data that map the training input to the target output (the answer to be predicted), and provide the machine learning model 190 that captures these patterns. The machine learning model 190 can include a linear regression model, a partial least squares regression model, a Gaussian regression model, a random forest model, a support vector machine model, a neural network, a ridge regression model, and so forth.

Training engine 182 can also be capable of validating a trained machine learning model 190 using a corresponding set of features of a validation set from training set generator 172. In some embodiments, training engine 182 can assign a performance rating for each of a set of trained machine learning models 190. A performance rating can correspond to an accuracy of a respective trained model, a speed of the respective model, and/or an efficiency of the respective model. Training engine 182 can select a trained machine learning model 190 having a performance rating that satisfies a performance criterion to be used by predictive engine 114, in accordance with embodiments described herein. Further details regarding training engine 182 are provided with respect to FIG. 6.

Predictive server 112 includes a predictive engine 114 that is capable of providing data from substrate measurement system 126 (e.g., a film thickness profile map) as input to trained machine learning model 190 and running trained model 190 on the input to obtain one or more outputs. In some embodiments, trained model 190 run by predictive engine 114 is selected by training engine 182 as having a performance rating that satisfies a performance criterion. As described further with respect to FIG. 7, in some embodiments, predictive engine 114 processes input data using model 190 to assess one or more conditions of one or more chamber components for a process chamber.

It should be noted that in some other implementations, the functions of server machines 170 and 180, as well as predictive server 112, can be provided by a larger or smaller number of machines. For example, in some embodiments, server machines 170 and 180 can be integrated into a single machine, while in some other or similar embodiments, server machines 170 and 180, as well as predictive server 112, can be integrated into a single machine. In general, functions described in one implementation as being performed by server machine 170, server machine 180, and/or predictive server 112 can also be performed on client device 120. In addition, the functionality attributed to a particular component can be performed by different or multiple components operating together.

In embodiments, a "user" can be represented as a single individual. However, other embodiments of the disclosure encompass a "user" being an entity controlled by a plurality of users and/or an automated source. For example, a set of individual users federated as a group of administrators can be considered a "user."

Figure 2A:
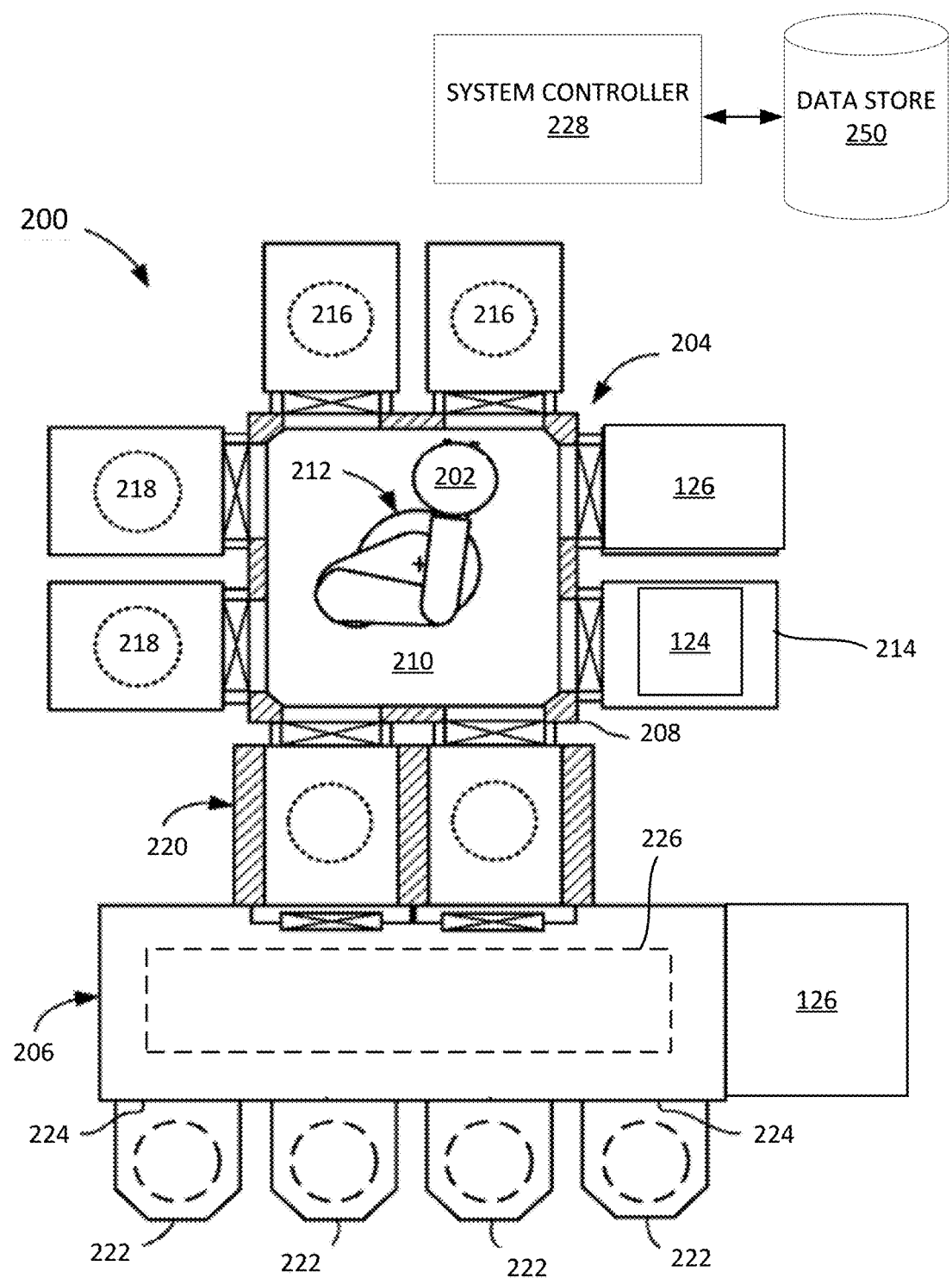
FIG. 2A is a top schematic view of an example manufacturing system, according to aspects of the present disclosure.

FIG. 2A is a top schematic view of an example manufacturing system 200, according to aspects of the present disclosure. Manufacturing system 200 can perform one or more processes on a substrate 202. Substrate 202 can be any suitably rigid, fixed-dimension, planar article, such as, e.g., a silicon-containing disc or wafer, a patterned wafer, a glass plate, or the like, suitable for fabricating electronic devices or circuit components thereon, according to aspects of the present disclosure. In some embodiments, manufacturing system 200 can be include or be a part of computer system architecture 110, in accordance with embodiments described with respect to FIG. 1.

Manufacturing system 200 can include a process tool 204 and a factory interface 206 coupled to process tool 204. Process tool 204 can include a housing 208 having a transfer chamber 210 therein. Transfer chamber 210 can include one or more processing chambers (also referred to as process chambers) 214, 216, 218 disposed therearound and coupled thereto. Processing chambers 214, 216, 218 can be coupled to transfer chamber 210 through respective ports, such as slit valves or the like. Transfer chamber 210 can also include a transfer chamber robot 212 configured to transfer substrate 202 between process chambers 214, 216, 218, load lock 220, etc. Transfer chamber robot 212 can include one or multiple arms where each arm includes one or more end effectors at the end of each arm. The end effector can be configured to handle particular objects, such as wafers.

In some embodiments, transfer chamber 210 can also include metrology equipment, such as substrate measurement system 126 attached thereto. Substrate measurement system 126 can be configured to generate metrology data associated with substrate 202 before or after a substrate process, while the substrate is maintained in a vacuum environment. As illustrated in FIG. 2, substrate measurement system 126 can be attached to transfer chamber 210 or disposed within transfer chamber 210. If substrate measurement system 126 is disposed within or coupled to transfer chamber 210, metrology data associated with substrate 202 can be generated without substrate 202 being removed from the vacuum environment (e.g., transferred to factory interface 206).

Process chambers 214, 216, 218 can be adapted to carry out any number of processes on substrates 202. A same or different substrate process can take place in each processing chamber 214, 216, 218. A substrate process can include atomic layer deposition (ALD), physical vapor deposition (PVD), chemical vapor deposition (CVD), etching, annealing, curing, pre-cleaning, metal or metal oxide removal, polishing, wet-processing, or the like. Other processes can be carried out on substrates therein.

A load lock 220 can also be coupled to housing 208 and transfer chamber 210. Load lock 220 can be configured to interface with, and be coupled to, transfer chamber 210 on one side and factory interface 206 on another side. Load lock 220 can have an environmentally-controlled atmosphere that can be changed from a vacuum environment (wherein substrates can be transferred to and from transfer chamber 210) to an atmospheric-pressure (or near atmospheric-pressure) inert-gas environment (wherein substrates can be transferred to and from factory interface 206), in some embodiments.

Factory interface 206 can be any suitable enclosure, such as an Equipment Front End Module (EFEM). Factory interface 206 can be configured to receive substrates 202 from substrate carriers 222 (e.g., Front Opening Unified Pods (FOUPs)) docked at various load ports 224 of factory interface 206. A factory interface robot 226 (shown dotted) can be configured to transfer substrates 202 between substrate carriers (also referred to as containers) 222 and load lock 220. In other and/or similar embodiments, factory interface 206 can be configured to receive replacement parts from replacement parts storage containers 222.

In some embodiments, manufacturing system 200 can include substrate measurement system 126 attached to factory interface 206. Substrate measurement system 126 attached to factory interface can be configured to generate metrology data associated with substrate 202 prior to substrate 202 being placed in the vacuum environment (e.g., transferred to load lock 220) and/or after substrate 202 is removed from the vacuum environment (e.g., removed from load lock 220).

Manufacturing system 200 can also be connected to a client device (e.g., client device 120 of FIG. 1) that is configured to provide information regarding manufacturing system 200 to a user (e.g., an operator). In some embodiments, the client device can provide information to a user of manufacturing system 200 via one or more graphical user interfaces (GUIs). For example, the client device can provide information regarding one or more chamber condition metrics (e.g. while performing a substrate process) of a processing chamber 214, 216, 218 via a GUI.

Manufacturing system 200 can also include or be coupled to a system controller 228. System controller 228 can be and/or include a computing device such as a personal computer, a server computer, a programmable logic controller (PLC), a microcontroller, and so on. System controller 228 can include one or more processing devices, which can be general-purpose processing devices such as a microprocessor, central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device can also be one or more special-purpose processing devices such as an application specific integrated circuit (ASIC), a field programmable gate array (FPGA), a digital signal processor (DSP), network processor, or the like. System controller 228 can include a data storage device (e.g., one or more disk drives and/or solid state drives), a main memory, a static memory, a network interface, and/or other components. System controller 228 can execute instructions to perform any one or more of the methodologies and/or embodiments described herein. In some embodiments, system controller 228 can execute instructions to perform one or more operations at manufacturing system 200 in accordance with a process recipe. The instructions can be stored on a computer readable storage medium, which can include the main memory, static memory, secondary storage and/or processing device (during execution of the instructions).

In some embodiments, system controller 228 can receive data from substrate measurement system 126 based on measurement of a substrate that has undergone processing by a process chamber 214, 216, 218. Data received by the system controller 228 can include spectral data, reflectometry data and/or other data for all or a portion of substrate 202. Data received from substrate measurement system 126 can be stored in a data store 250. Data store 250 can be included as a component within system controller 228 or can be a separate component from system controller 228. In some embodiments, data store 250 can be or include a portion of data store 150, as described with respect to FIG. 1.

Figure 2B:
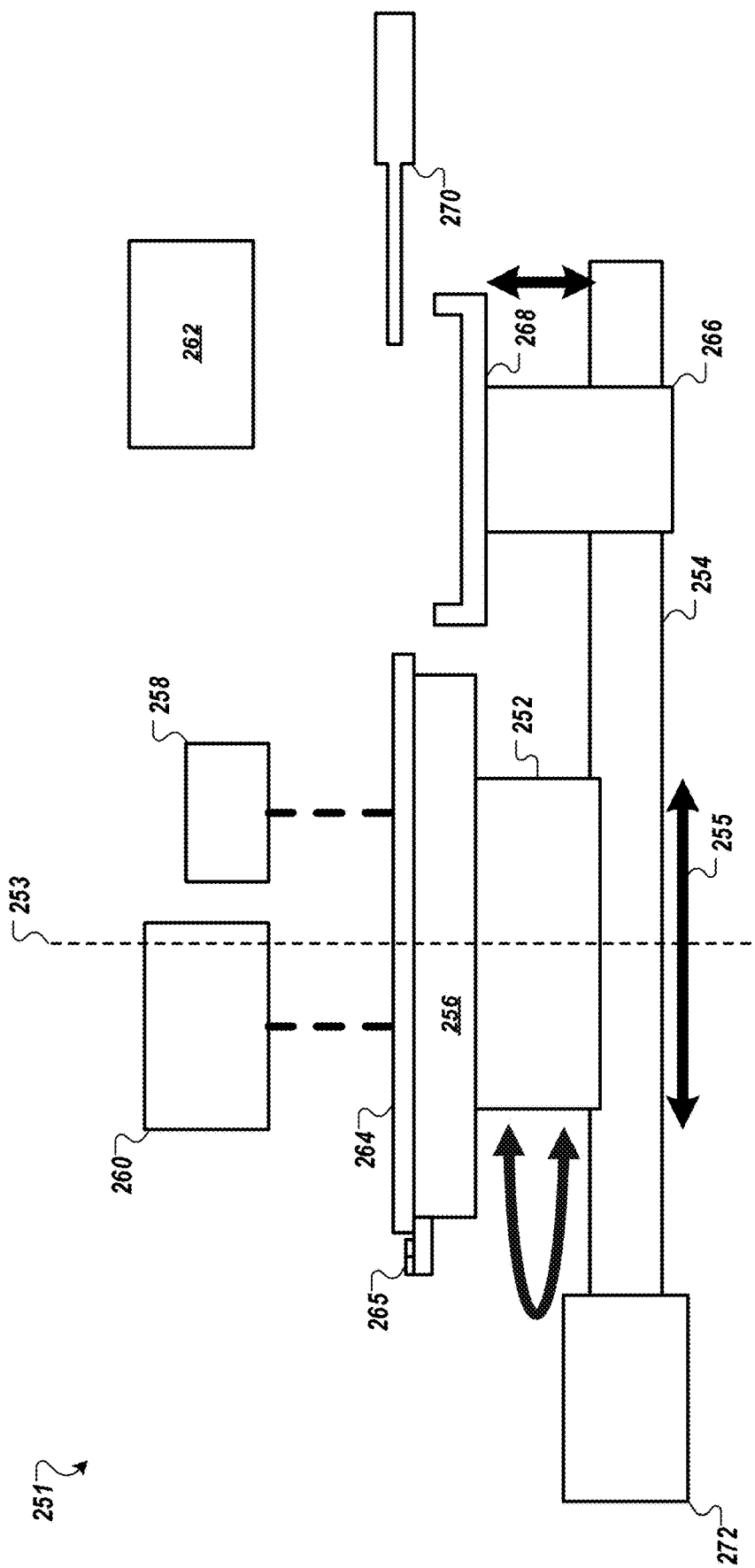
FIG. 2B is a cross-sectional schematic side view of a substrate measurement system included in the example manufacturing system of FIG. 2A, according to aspects of the present disclosure.

FIG. 2B illustrates one embodiment of a substrate measurement system 251 that may be used to measure processed substrates. Substrate measurement system 251 may be an integrated measurement and/or imaging system (e.g., integrated reflectometry (IR) system) configured for measuring film properties (e.g., such as thickness) across a surface of a substrate 264 after the substrate 264 is processed in a processing chamber. Reflectometry is a measurement technique that uses measured changes in light reflected from an object to determine geometric and/or material properties of the object. Reflectance spectrometers measure the intensity of reflected light across a range of wavelengths. For dielectric films these intensity variations may be used to determine the thickness of the film.

Process results, including film thicknesses, can be monitored across one or more substrates for etch and deposition processes using substrate measurement system 251, for example. The integrated measurement and/or imaging system may be used to measure a surface of a substrate 264 while the substrate 264 is still in the device manufacturing system. Substrate measurement system 251 may correspond to substrate measurement system 126 in embodiments. Substrate measurement system 251 may be connected to a factory interface or to a transfer chamber. Alternatively, the substrate measurement system 251 may be positioned in an interior of the factory interface or transfer chamber. Substrate measurement system 251 may also be a standalone system that is not connected to a manufacturing system. Substrate measurement system 251 may be mechanically isolated from a factory interface and from an external environment to protect substrate measurement system 251 from external vibrations. In some embodiments, substrate measurement system 251 and its contained components may provide analytical measurements (e.g., thickness measurements) that may provide a uniformity profile across a surface of a substrate 264, referred to herein as a profile map. A computing device may process that data from substrate measurement system 251 and provide feedback to a user. Substrate measurement system 251 may be an assembly that has the ability to measure film thicknesses and/or other film properties such as optical constants, particle counts, roughness, etc. across a portion of a substrate or an entire substrate after it has been processed in a chamber. The results of the measurements may be used to determine when to perform maintenance on a process chamber, when to perform further testing on a substrate, when to flag a substrate as being out-of-specification, and so on.

When the substrate 264 is lowered onto and secured to a substrate support 256 (e.g., a chuck), the center of the substrate 264 may be offset from the center of the chuck. A processing device of substrate measurement system 251 may determine one or more coordinate transformations between the center of the substrate 264 and the center of the chuck (the center of the chuck corresponds to the axis of rotation about which the chuck rotates) 256, and apply the one or more coordinate transformations to correct the offset, as described in greater detail below.

Substrate measurement system 251 may include a rotational actuator 252 and a linear actuator 254. Rotational actuator 252 may be a motor, a rotary actuator (e.g., an electric rotary actuator), or the like. Linear actuator 254 may be an electric linear actuator, which may convert rotational motion in motors into linear or straight motions along an axis. Substrate measurement system 251 may include a substrate support 256, a camera 208, a sensor 260, and a processing device 262.

Substrate support 256 may be a vacuum chuck, an electrostatic chuck, a magnetic chuck, a mechanical chuck (e.g., a four jaw chuck, a three jaw chuck, an edge/ring clamp chuck, etc.) or other type of chuck. Substrate support 256 may secure a substrate 264 (e.g., a wafer). Rotational actuator 252 may rotate substrate support 256 about a first axis 253. Rotational actuator 252 may be controlled by a servo controller and/or servomotor, which may allow for precise control of a rotational position, velocity and/or acceleration of the rotational actuator and thus of substrate support 256. Linear actuator 254 may move substrate support 256 linearly along a second axis 255. Linear actuator 254 may be controlled by a servo controller and/or servomotor 272, which may allow for precise control of a linear position, velocity, and acceleration of linear actuator 254, and thus of substrate support 256.

Camera 258 may be positioned above substrate support 256, and may generate one or more images of substrate 264 held by substrate support 256. Camera 258 may be an optical camera, an infrared camera, or other suitable type of camera. A sensor 260 may also be positioned above chuck 256, and may measure at least one target position on the substrate at a time (e.g., may generate a reflectometry measurement or other measurement of the target position). Camera 258 and sensor 260 may be fixed in a stationary position on substrate measurement system 251, while chuck 256 may be moved in an r-theta motion by rotation actuator 252 and linear actuator 254.

In some embodiments, processing device 262 may determine, based on the one or more images of substrate 264 generated by camera 258, that substrate 264 is not centered on chuck 256. Substrate 264 may be not centered on substrate support 256 when it is initially placed on substrate support 256. A robot blade 270 may place substrate 264 on a transfer station 268 (e.g., a set of lift pins). Substrate support 256 may be moved in a first direction along second axis 255 such that chuck 256 is positioned at transfer station 268. Transfer station 268 may be situated on a lift mechanism 266 (or may be a set of lift pins), which may move transfer station 268 up and down in a vertical direction (that is perpendicular to second axis 255 and parallel to first axis 253). Substrate 264 may be received by substrate support 256 while substrate support 256 is positioned at transfer station 268. Substrate 264 may not be centered on substrate support 256. Substrate support 256 may be moved in a second direction along second axis 255 until an edge of substrate 264 is detected to be at a target position by sensor 260.

The substrate support may be rotated 360 degrees, and images may be generated during the rotation of the substrate support. One or more of the measurements and/or images may be taken with the chuck at various different theta values, and the detected location of the edge may vary. A change in the detected edge may indicate that the substrate (which may be a circular substrate) is off center. Additionally, the determined change in the detected edge may be used to compute the amount of offset.

In one embodiment, the parameters (r, theta) determine the offset of the substrate relative to the stage. With these parameters, the motion system can create forward and inverse transformations that converts (r, theta) coordinates of the stage to (r, theta) coordinates of the substrate. The motion system can then compute trajectories in the space of the substrate while sending commands to move the motors attached to the substrate support 256. In one embodiment, the motion system can compute trajectories in an arbitrary space because it runs a real-time control software that is connected to the motion drives of the linear actuator and the rotational actuator (e.g., through an EtherCAT network). Controller 262 may compute the corrected trajectory and transmit commanded positions to the motion drives in real-time (e.g., at a 1 kHz rate).

In some embodiments, the rotation of substrate support 256 by rotational actuator 252 for measurement of a target position causes an offset between a field of view of sensor 260 and the target position on substrate 264 due to substrate 264 not being centered on chuck 256. In this case, linear actuator 254 may move substrate support 256 linearly along the second axis to correct the offset. Then, sensor 260 may measure target positions on substrate 264. Once measurements of all target points on the substrate are measured, processing device 262 may determine a uniformity profile across the surface of substrate 264 based on the measurements.

In some embodiments, processing device 262 may determine one or more coordinate transformations between a center of substrate support 256 (corresponding to first axis 253 about which chuck 256 rotates) and a center of substrate 264 that are applied during the rotation of substrate support 256 to correct for the offset.

Figure 2C:
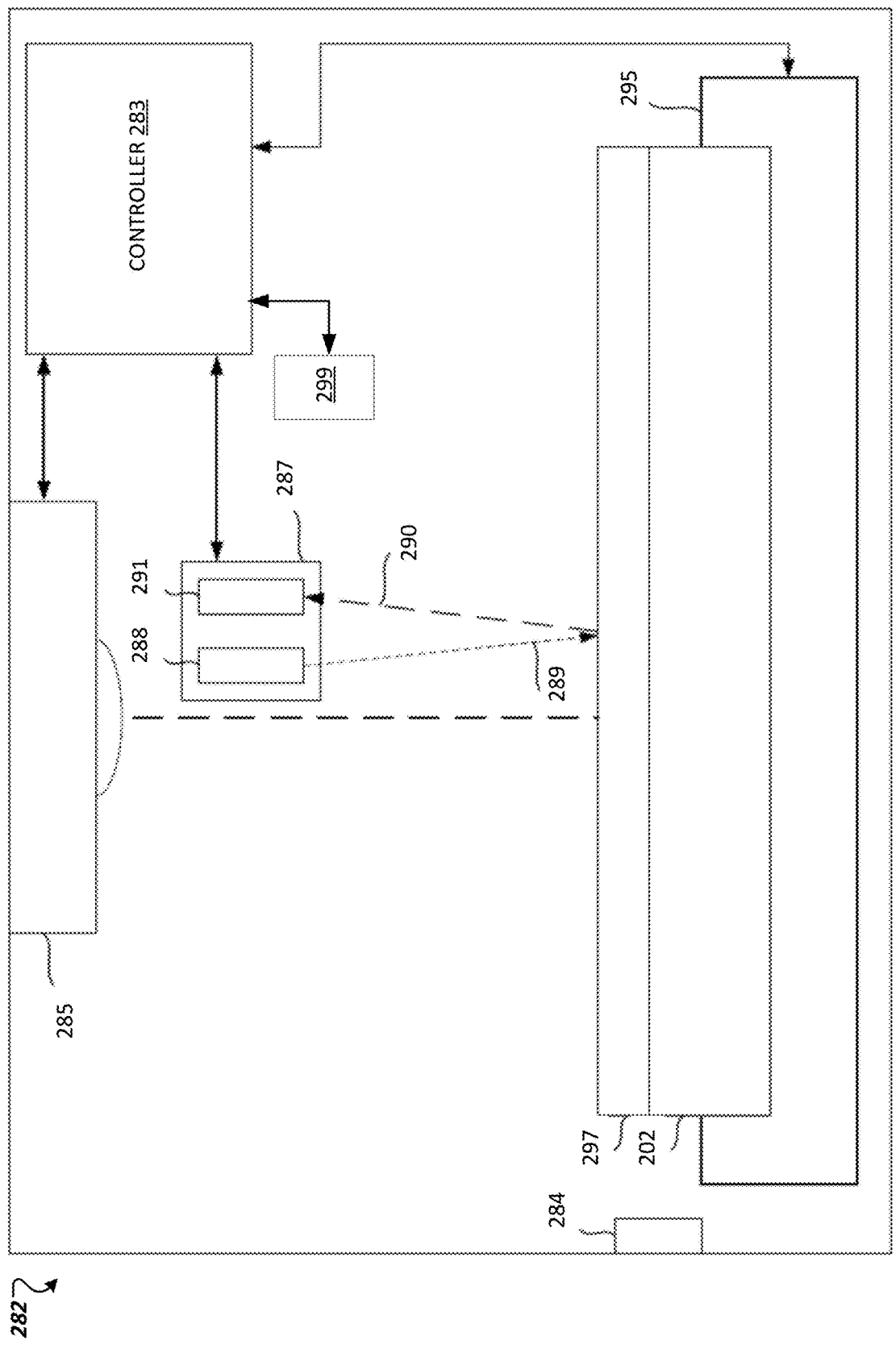
FIG. 2C is a cross-sectional schematic side view of a substrate measurement subsystem, according to aspects of the present disclosure.

FIG. 2C is a cross-sectional schematic side view of a substrate measurement subsystem 282, according to aspects of the present disclosure. Substrate measurement subsystem 282 may be configured to obtain measurements for one or more portions of a substrate, such as substrate 202 of FIG. 2A, prior to or after processing of substrate 202 at a processing chamber. Substrate measurement subsystem 282 may correspond to substrate measurement system 126 of FIG. 2A in embodiments. Substrate measurement subsystem 282 may obtain measurements for a portion of substrate 202 by generating data associated with the portion of substrate 202. In some embodiments, substrate measurement subsystem 282 may be configured to generate spectral data, positional data, and/or other property data associated with substrate 202.

The substrate measurement subsystem 282 may be configured to generate one or more types of data for the substrate, including spectral data, positional data, substrate property data, etc. The substrate measurement subsystem 282 can generate the data for the substrate in response to a request to obtain one or more measurements for the substrate before or after the substrate is processed at the manufacturing system. The substrate measurement subsystem 282 may include one or more components that facilitate the generation of data for the substrate. For example, the substrate measurement subsystem can include a spectra sensing component for sensing spectra or spectrum from a portion of the substrate and generating spectral data for the substrate. In some embodiments, the spectra sensing component can be an interchangeable component that can be configurable based on a type of process performed at the manufacturing system or a target type of measurements to be obtained at the substrate measurement subsystem. For example, one or more components of the spectra sensing component can be interchanged at the substrate measurement subsystem to enable the collection of reflectometry spectral data, ellipsometry spectral data, hyperspectral imaging data, chemical imaging (e.g., x-ray photoelectron spectroscopy (XPS), energy-dispersive x-ray spectroscopy (EDX), (x-ray fluorescence (XRF), etc.) data, and so forth.

Substrate measurement subsystem 282 may include a controller 283 configured to execute one or more instructions for generating data associated with a portion of substrate 202. Substrate measurement subsystem 282 may include a substrate sensing component 284 configured to detect when substrate 202 is transferred to substrate measurement subsystem 282. Substrate sensing component 284 may include any component configured to detect when substrate 202 is transferred to substrate measurement subsystem 282. For example, substrate sensing component 284 may include an optical sensing component that transmits an optical beam across an entrance to substrate measurement subsystem 282. Substrate sensing component 284 may detect that a substrate 202 has been transferred to substrate measurement subsystem 282 responsive to substrate 202 breaking the optical beam transmitted across the entrance to substrate measurement subsystem 282 as substrate 202 is placed within substrate measurement subsystem 282. Responsive to detecting that substrate 202 has been transferred to substrate measurement subsystem 282, substrate sensing component 284 may transmit an indication to controller 283 indicating that substrate 202 has been transferred to substrate measurement subsystem 282.

In some embodiments, substrate sensing component 284 may be further configured to detect identifying information associated with substrate 202. In some embodiments, substrate 202 may be embedded within a substrate carrier (not shown) when transferred to substrate measurement subsystem 282. The substrate carrier may include one or more registration features that enable identification of substrate 202. For example, an optical sensing component of substrate sensing component 284 may detect that substrate 202, embedded within the substrate carrier, has broken the optical beam transmitted across the entrance to substrate measurement subsystem 282. The optical sensing component may further detect one or more registration features included on the substrate carrier. Responsive to detecting the one or more registration features, the optical sensing component may generate an optical signature associated with the one or more registration features. Substrate sensing component 284 may transmit the optical signature generated by the optical sensing component to controller 283 along with the indication that the substrate has been placed within substrate measurement subsystem 282. Responsive to receiving the optical signature from sensing component 214, controller 283 may analyze the optical signature to determine the identifying information associated with substrate 202. The identifying information associated with substrate 202 may include an identifier for substrate 202, an identifier for a process for substrate 202 (e.g., a batch number or a process run number), an identifier of a type for substrate 202 (e.g., a wafer, etc.), and so forth.

Substrate measurement subsystem 282 may include one or more components configured to determine a position and/or an orientation of substrate 202 within substrate measurement subsystem 282. The position and/or orientation of substrate 202 may be determined based on an identification of a reference location of substrate 202. A reference location may be a portion of substrate 202 that includes an identifying feature that is associated with a specific portion of substrate 202. For example, substrate 202 may have a reference tag embedded in a center portion of substrate 202. In another example, substrate 202 may have one or more structural features included on the surface of the substrate 202 at a center portion of substrate 202. Controller 283 may determine an identifying feature associated with a specific portion of substrate 202 based on determined identifying information for substrate 202. For example, responsive to determining that substrate 202 is a wafer, controller 283 may determine one or more identifying features that are generally included at a portion of a wafer.

Controller 283 may identify the reference location for substrate 202 using one or more camera components 285 configured to capture image data for substrate 202. Camera components 285 may generate image data for with one or more portions of the substrate 202 and transmit the image data to controller 283. Controller 283 may analyze the image data to identify an identifying feature associated with a reference location for substrate 202. Controller 283 may further determine a position and/or orientation of substrate 202 as depicted in the image data based on the identified identifying feature of substrate 202. Controller 283 may determine a position and/or orientation of substrate 202 based on the identified identifying feature of substrate 202 and the determined position and/or orientation of substrate 202 as depicted in the image data.

Responsive to determining the position and/or orientation of substrate 202, controller 283 may generate positional data associated with one or more portions of substrate 202. In some embodiments, the positional data may include one or more coordinates (e.g., Cartesian coordinates, polar coordinates etc.) each associated with a portion of substrate 202, where each coordinate is determined based on a distance from the reference location for substrate 202. For example, responsive to determining the position and/or orientation of substrate 202, controller 283 may generate first positional data associated with a portion of substrate 202 that includes the reference location, where the first positional data includes a Cartesian coordinate of (0,0). Controller 283 may generate second positional data associated with a second portion of substrate 202 that is relative to the reference location. For example, a portion of substrate 202 that is located approximately 2 nanometers (nm) due east of the reference location may be assigned a Cartesian coordinate of (0,1). In another example, a portion of substrate 202 that is located 5 nms due north of the reference location may be assigned a Cartesian coordinate of (1,0).

Controller 283 may determine one or more portions of substrate 202 to measure based on positional data determined for substrate 202. In some embodiments, controller 283 may receive one or more operations of a process recipe associated with substrate 202. In such embodiments, controller 283 may further determine the one or more portions of substrate 202 to measure based on one or more operations of the process recipe. For example, controller 283 may receive an indication that an etch process was performed for substrate 202 where several structural features were etched onto the surface of substrate 202. As a result, controller 283 may determine one or more structural features to measure and the expected locations of the features at various portions of substrate 202.

Substrate measurement subsystem 282 may include one or more measurement components for measuring substrate 202. In some embodiments, substrate measurement subsystem 282 may include one or more spectra sensing components 220 configured to generate spectral data for one or more portions of substrate 202. As discussed previously, spectral data may correspond to an intensity (i.e., a strength or amount of energy) of a detected wave of energy for each wavelength of the detected wave.

In one embodiment, multiple wave lengths may be included in reflected energy waves received by substrate measurement subsystem 282. Each reflected energy wave may be associated with a different portion of substrate 202. In some embodiments, an intensity may be measured for each reflected energy wave received by substrate measurement subsystem 282. Each intensity can be measured for each wavelength of reflected energy waves received by substrate measurement subsystem 282. The association between each intensity and each wavelength can be the basis for the formation of spectral data. In some embodiments, one or more wavelengths can be associated with an intensity value that is outside of an expected range of intensity values. In such embodiments, the intensity value that is outside of the expected range of intensity values can be an indication that a defect exists at a portion of substrate 202.

The measurement components for measuring substrate 202 can also include non-spectral sensing components configured to collect and generate non-spectral data. For example, the measurement components can include an eddy current sensor or a capacitive sensor. Although some embodiments of the present description may refer to collecting and using spectral data for substrate 202, embodiments of the present description can be applicable to non-spectral data collected for substrate 202.

A spectra sensing component 287 may be configured to detect waves of energy reflected from a portion of substrate 202 and generate spectral data associated with the detected waves. Spectra sensing component 287 may include a wave generator 288 and a reflected wave receiver 224. In some embodiments, wave generator 288 may be a light wave generator configured to generate a beam of light towards a portion of substrate 202. In such embodiments, reflected wave receiver 289 may be configured to receive a reflected light beam from the portion of substrate 202. Wave generator 288 may be configured to generate an energy stream 289 (e.g., a light beam) and transmit energy stream 289 to a portion of substrate 202. A reflected energy wave 290 may be reflected from the portion of substrate 202 and received by reflected wave receiver 291. Although FIG. 2C illustrates a single energy wave reflected off the surface of substrate 202, multiple energy waves may be reflected off the surface of substrate 202 and received by reflected wave receiver 291.

Responsive to reflected wave receiver 291 receiving reflected energy wave 290 from the portion of substrate 202, spectra sensing component 287 may measure a wavelength of each wave included in reflected energy wave 289. Spectra sensing component 287 may further measure an intensity of each measured wavelength. Responsive to measuring each wavelength and each wavelength intensity, spectra sensing component 287 may generate spectral data for the portion of substrate 202. Spectra sensing component 287 may transmit the generated spectral data to controller 283. Controller 283 may, responsive to receiving the generated spectral data, generate a mapping between the received spectral data and positional data for the measured portion of substrate 202.

Substrate measurement subsystem 282 may be configured to generate a specific type of spectral data based on a type of measurement to be obtained at substrate measurement subsystem 282. In some embodiments, spectra sensing component 287 may be a first spectra sensing component that is configured to generate one type of spectral data. For example, spectra sensing component 287 may be configured to generate reflectometry spectral data, ellipsometry spectral data, hyperspectral imaging data, chemical imaging data, thermal spectral data, or conductive spectral data. In such embodiments, the first spectra sensing component may be removed from substrate measurement subsystem 282 and replaced with a second spectra sensing component configured to generate a different type of spectral data (e.g., reflectometry spectral data, ellipsometry spectral data, hyperspectral imaging data, or chemical imaging data).

Controller 283 may determine a type of data (i.e., spectral data, non-spectral data) to be generated for substrate 202 based on a type of measurement to be obtained for one or more portions of substrate 202. In some embodiments, controller 283 may determine the one or more types of measurements based on a notification received from system controller 228 of FIG. 2A. In other or similar embodiments, controller 283 may determine the one or more types of measurements based on an instruction to generate a measurement for a portion of substrate 202. Responsive to determining the one or more types of measurements to be obtained, controller 283 may determine the type of data to be generated for substrate 202. For Example, controller 283 can determine that spectral data is to be generated for substrate 202 and that the second spectra sensing component is an optimal sensing component for obtaining the determined type of measurements for the one or more portions of substrate 202. Responsive to determining the second sensing component is the optimal sensing component, controller 283 may transmit a notification to the system controller indicating that the first spectra sensing component should be replaced with the second spectra sensing component and the second spectra sensing component should be used to obtain the one or more types of measurements for the one or more portions of substrate 202. System controller 128 may transmit the notification to a client device connected to the manufacturing system where the client device may provide the notification to a user of the manufacturing system (e.g., an operator) via a GUI.

In other or similar embodiments, spectra sensing component 287 may be configured to generate multiple types of spectral data. In such embodiments, controller 283 may cause spectra sensing component 287 to generate a specific type of spectral data based on the type of measurements to be obtained for one or more portions of substrate 202, in accordance with previously described embodiments. Responsive to determining the type of measurements to be obtained, controller 283 may determine that a first type of spectral data is to be generated by spectra sensing component 287. Based on the determination that the first type of spectral data is to be generated by spectra sensing component 287, controller 283 may cause spectra sensing component 287 to generate the first type of spectral data for the one or more portions of substrate 202.

As described previously, controller 283 may determine one or more portions of substrate 202 to measure at substrate measurement subsystem 282. In some embodiments, one or more measurement components, such as spectra sensing component 287, may be stationary components within substrate measurement subsystem 282. In such embodiments, substrate measurement subsystem 282 may include one or more positional components 295 configured to modify a position and/or an orientation of substrate 202 with respect to spectra sensing component 287. In some embodiments, positional components 295 may be configured to translate substrate 202 along a first axis and or a second axis, relative to spectra sensing component 287. In other or similar embodiments, positional components 295 may be configured to rotate substrate 202 around a third axis relative to spectra sensing component 287.

As spectra sensing component 287 generates spectral data for one or more portions of substrate 202, positional components 295 may modify the position and/or orientation of substrate 202 in accordance with the one or more determined portions to be measured for substrate 202. For example, prior to spectra sensing component 287 generating spectral data for substrate 202, positional components 295 may position substrate 202 at Cartesian coordinate (0,0) and spectra sensing component 287 may generate first spectral data for substrate 202 at Cartesian coordinate (0,0). Responsive to spectra sensing component 287 generating first spectral data for substrate 202 at Cartesian coordinate (0,0), positioning components 240 may translate substrate 202 along a first axis so that spectra sensing component 287 is configured to generate second spectral data for substrate 202 at Cartesian coordinate (0,1). Responsive to spectra sensing component 287 generating second spectral data for substrate 202 at Cartesian coordinate (0,1), controller 283 may rotate substrate 202 along a second axis so that spectra sensing component 287 is configured to generate third spectral data for substrate 202 at Cartesian coordinate (1,1). This process may occur multiple times until spectral data is generated for each determined portion of substrate 202.

In some embodiments, one or more layers 297 of material may be included on a surface of substrate 202. The one or more layers 297 may include etch material, photoresist material, mask material, deposited material, etc. In some embodiments, the one or more layers 297 may include an etch material to be etched according to an etch processed performed at a processing chamber. In such embodiments, spectral data may be collected for one or more portions of the un-etched etch material of the layer 212 deposited on substrate 202, in accordance with previously disclosed embodiments. In other or similar embodiments, the one or more layers 297 may include an etch material that has already been etched according an etch process at the processing chamber. In such embodiments, one or more structural features (e.g., lines, columns, openings, etc.) may be etched into the one or more layers 297 of substrate 202. In such embodiments, spectral data may be collected for one or more structural features etched into the one or more layers 297 of substrate 202.

In some embodiments, substrate measurement subsystem 282 may include one or more additional sensors configured to capture additional data for substrate 202. For example, substrate measurement subsystem 282 may include additional sensors configured to determine a thickness of substrate 202, a thickness of a film deposited on the surface of substrate 202, etc. Each sensor may be configured to transmit captured data to controller 283.

Responsive to receiving at least one of the spectral data, the positional data, or the property data for the substrate 202, controller 283 may transmit the received data to system controller 128 for processing and analysis, in accordance with embodiment described herein.

In some embodiments, substrate measurement subsystem 282 includes one or more image capture devices 299 connected to controller 283, such as a camera (e.g., including a complementary metal oxide semiconductor (CMOS) sensor or a charge coupled device (CCD) sensor). The image capture device(s) 299 may generate images (e.g., two-dimensional (2D) color images, infrared (IR) images, near-infrared images, etc.). The images may be processed together with spectral data generated by spectra sensing component 287 by one or more trained machine learning model to make determinations about one or more chamber components in embodiments.

Figure 3:
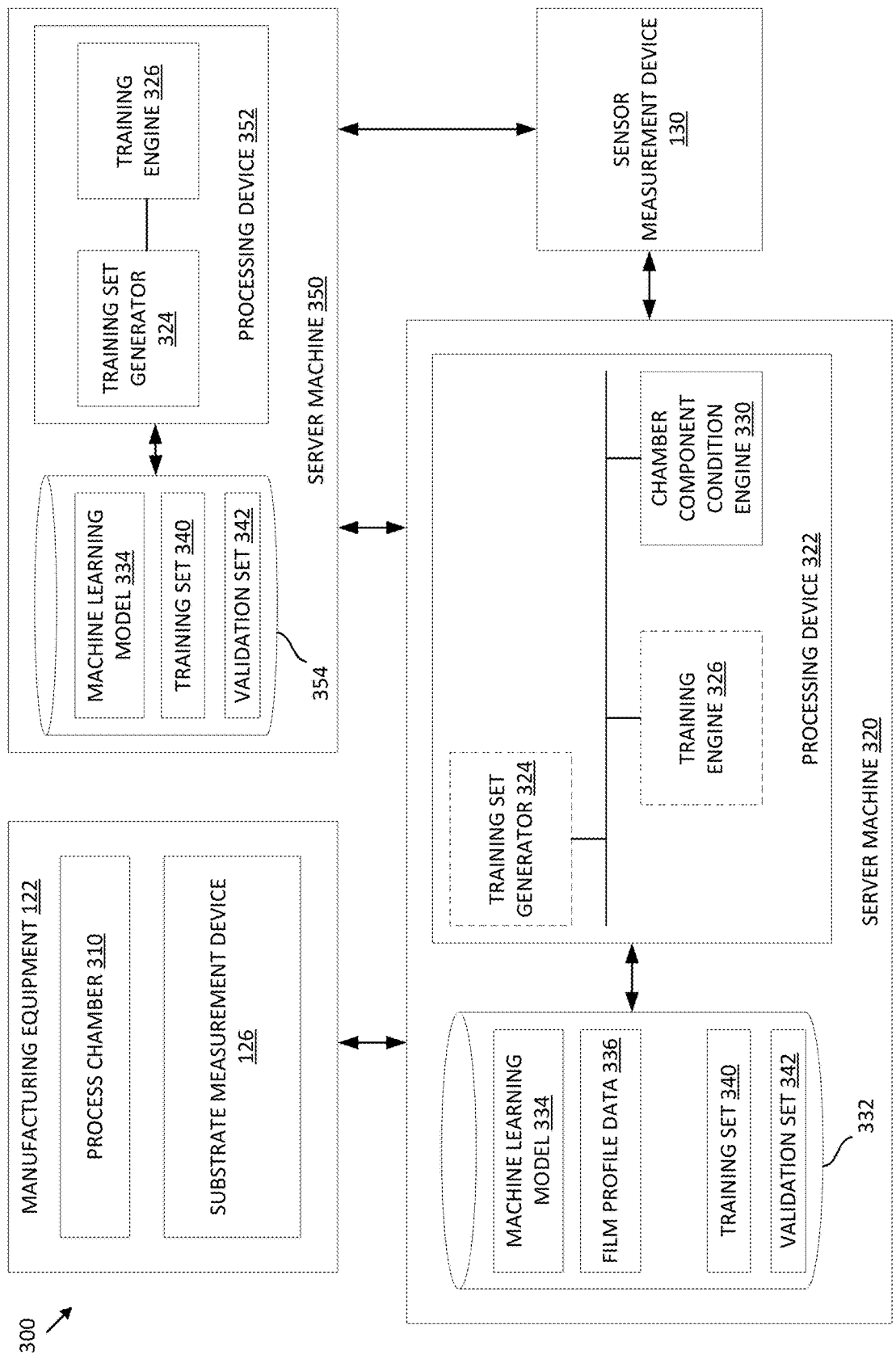
FIG. 3 depicts an illustrative system architecture for chamber component condition prediction of a processing chamber, according to aspects of the present disclosure.

FIG. 3 depicts an illustrative system architecture 300 for chamber component condition prediction or assessment of a processing chamber, according to aspects of the present disclosure. In some embodiments, system architecture 300 can include or be a part of one or more components of computer architecture 100 and/or manufacturing system 200. System architecture 300 can include one or more components of manufacturing equipment 122 (e.g., substrate measurement system 126), server machine 320, and server machine 350.

As described previously, manufacturing equipment 122 can produce products following a recipe or performing runs over a period of time. Manufacturing equipment 122 can include a process chamber 310 configured to perform a substrate process for a substrate according to a substrate process recipe. In some embodiments, the recipe may be a blanket wafer recipe that deposits a film over a test substrate. In some embodiments, process chamber 310 can be any of process chamber 214, 218, 218, described with respect to FIG. 2. Manufacturing equipment 122 can also include substrate measurement system 126, as described herein.

Manufacturing equipment 122 can be coupled to server machine 320. Server machine 320 can include processing device 322 and/or data store 332. In some embodiments, processing device 322 can be configured to execute one or more instructions to perform operations at manufacturing equipment 122. For example, processing device 322 can include or be a part of system controller 228, described with respect to FIG. 2. Data store 332 can include or be part of data store 150 and/or data store 250, in some embodiments.

Processing device 322 can be configured to receive data from one or more components of manufacturing equipment 122 (i.e., via a network). For example, processing device 322 can receive film thickness profile data (e.g., a wafer map) 336 collected by substrate measurement system 126 after a substrate has been processed in a process chamber. In another example, processing device 322 can receive metrology data collected by other metrology equipment before and/or after the substrate process for the substrate. Metrology data can include a metrology measurement value generated for the substrate by integrated metrology equipment. In some embodiments, processing device 322 can store the received spectral data, film thickness profile data and/or the received metrology data at data store 332.

Processing device 352 can include a chamber component condition engine 330. Chamber component condition engine 330 at processing device 322 can be configured to determine chamber component conditions of one or more chamber components in a processing chamber 310 that processed a measured substrate. Chamber component condition engine 330 can determine one or more chamber component condition metrics for one or more chamber components of a process chamber 310 that processed a substrate from film thickness profile data 336. In some embodiments, the chamber component conditions metric may include a series of values (e.g., vector, matrix, etc.) indicating a correlation of a particular data combination, correlation, pattern, and/or relationship present in the sensor data. For example, the chamber component condition metric may include a feature vector including binary values indicating the presence or absence of a particular feature in the data.

The chamber component condition metrics may be compared against a known pattern and/or combination of chamber component metrics (e.g., target chamber component metrics). Target chamber component metrics may be associated with new or unworn chamber components. In response to determining that the chamber component condition metrics satisfy one or more chamber component condition threshold (e.g., conditions relating to a excessive wear of an electrostatic chuck mesa, or seal band, or lift pin hole, conditions relating to missing mesas, conditions relating to recesses or valleys in a surface of a substrate support, conditions relating to concentricity of circular elements on a surface of a substrate support, conditions relating to planarity of a surface of a substrate support, etc.), chamber component condition engine 330 can flag or schedule a process chamber for maintenance and/or may provide an alert to a user. A chamber component condition threshold may be a specified combination of values indicated by the chamber component condition metrics.

In some embodiments, a curve or other numerical or non-numerical corollary is generated based on one or more chamber component metrics of a healthy or standard chamber component over time. The curve or other numerical or non-numerical corollary may represent, for example, the standard wear of a seal band, mesas and/or lift pin locations of an electrostatic chuck or other substrate support over time. The current chamber component condition metrics may be compared against the curve or other numerical or non-numerical corollary. A number of hours that the chamber component has been used to process substrates and/or a number of substrates that the chamber component has been used to process may be known. This information and the current chamber component condition metrics may be used to plot the current chamber condition metrics against the curve or other numerical or non-numerical corollary (e.g., to determine where the current chamber component metrics fall on the curve or other numerical or non-numerical corollary). If the current chamber condition metrics are within a threshold distance from the curve, then a determination may be made that the chamber component condition is as expected. If the current chamber condition metrics deviate from the curve or other numerical or non-numerical corollary by more than the threshold distance, then a determination may be made that the chamber component condition is not as expected (e.g., that the chamber component wear is faster than usual for one or more areas or components of the chamber component).

As illustrated in FIG. 3, processing device 322 can include a training set generator 324 and/or a training engine 326, in some embodiments. In some embodiments, training set generator 324 can correspond to training set generator 172 and/or training engine 326 can correspond to training engine 182, described with respect to FIG. 1. Training set generator 324 can be configured to generate training sets 340 to train machine learning model 334 or a set of machine learning models 334. For example, training set generator 324 can generate a training input based on historical film thickness profile data 336. The film thickness profile data 336 (e.g., film profile maps) may be associated with labels identifying states of one or more features or regions of one or more chamber components (e.g., amount of wear or erosion of a seal band in one or more regions, amount of wear or erosion to one or more mesas, etc.). In some embodiments, training set generator 324 can retrieve the historical film profile data 336 (e.g., film thickness profile data) from data store 332 to generate the training input. Training set generator 324 can generate a target output indicating a chamber component condition (e.g., chamber component condition metrics) for the training input based on historical film profile data 336. Training set generator 324 can include the generated training input and the generated target output in a training set 340. The training set 340 may additionally include, for each historical film profile, an indicator of ages of one or more components (e.g., optionally represented as a number of hours that a component has been used to process substrates and/or a number of substrates that have been processed using the chamber component). Further details regarding generating training set 340 are provided with respect to FIG. 5.

Training engine 326 can be configured to train, validate and/or test the machine learning model 334 or sets of machine learning models 334. Training engine 326 can provide training set 340 to train machine learning model(s) 334 and store trained machine learning model(s) 334 at data store 332. In some embodiments, training engine 326 can use a validation set 342 to validate a trained machine learning model 334. Validation set 342 can include film profile data 336 and associated chamber component condition metrics. Training set generator 324 and/or training engine 326 can generate validation set 342 based on historical film profile data 336. In some embodiments, validation set 342 can include historical film profile data 336 that is different from historical film profile data 336 included in training set 340.

Training engine 326 can provide the historical film profile data 336 as an input to a trained machine learning model 334 and can extract a chamber component condition metric for a chamber component of a processing chamber from one or more outputs of the trained model 334. The input may additionally include ages of one or more components and/or one or more images of a substrate that was used to generate the historical film profile data 236. Training engine 326 can assign a performance score to the trained model 334 based on an accuracy of the chamber component condition metric for the chamber component of the processing chamber. Training engine 326 can select the trained model 334 to be used to assess conditions of one or more chamber components of a process chamber based on film profile data for a substrate processed by the process chamber.

As discussed previously, training set generator 324 and/or training engine 326 can be components of processing device 322 at server 320, in some embodiments. In additional or alternative embodiments, training set generator 324 and/or training engine 326 can be components of processing device 352 at server 350. Server 350 can include or be part of a computing system that is separate from manufacturing system 200. As described previously, server 320 can include or be part of system controller 228, described with respect to FIG. 2A, in some embodiments. In such embodiments, server 350 can include or be part of a computing system that is coupled to system controller 228 (i.e., via a network), but is separate from system controller 228. For instance, a user of manufacturing system 200 may be provided with access to data stored at one or more portions of data store 332 or one or more processes executed at processing device 322. However, the user of manufacturing system 200 may not be provided with access to any data stored at one or more portions of data store 354 or any processes executed at processing device 352.

Processing device 352 can be configured to execute training set generator 324 and/or training engine 326 in a similar fashion as processing device 322. In some embodiments, server 350 can be coupled to manufacturing equipment 122 and/or inline metrology equipment 130 via a network. As such, processing device 352 can obtain film thickness profile data 336 and chamber component condition metrics corresponding to film profile data 336 to be used by training set generator 324 and/or training engine 326 to generate training set 340 and validation set 342, in accordance with embodiments described with respect to processing device 322. In other or similar embodiments, server 350 is not coupled to manufacturing equipment 122 and/or external metrology equipment 130. Accordingly, processing device 352 can film thickness profile data 336 from processing device 322.

Training set generator 324 at processing device 352 can generate training set 340 in accordance with previously described embodiments. Training engine 326 at processing device 352 can train and/or validate machine learning model 334, in accordance with previously described embodiments. In some embodiments, server 350 can be coupled to other manufacturing equipment and/or other server machines that are different from manufacturing equipment 122 and/or server machine 320. Processing device 352 can obtain film profile data 336 from the other manufacturing equipment and/or server machines, in accordance with embodiments described herein. In some embodiments, training set 340 and/or validation set 342 can be generated based on film thickness profile data 336 obtained for substrates processed at process chamber 310 as well as other film profile data obtained for other substrates processed at process chambers at other manufacturing systems.

In response to training engine 326 selecting trained model 334 to be used, processing device 352 can transmit trained model 334 to processing device 322. Chamber component condition engine 330 can use trained model 334 to provide chamber component condition assessments, as previously described.

Figure 4:
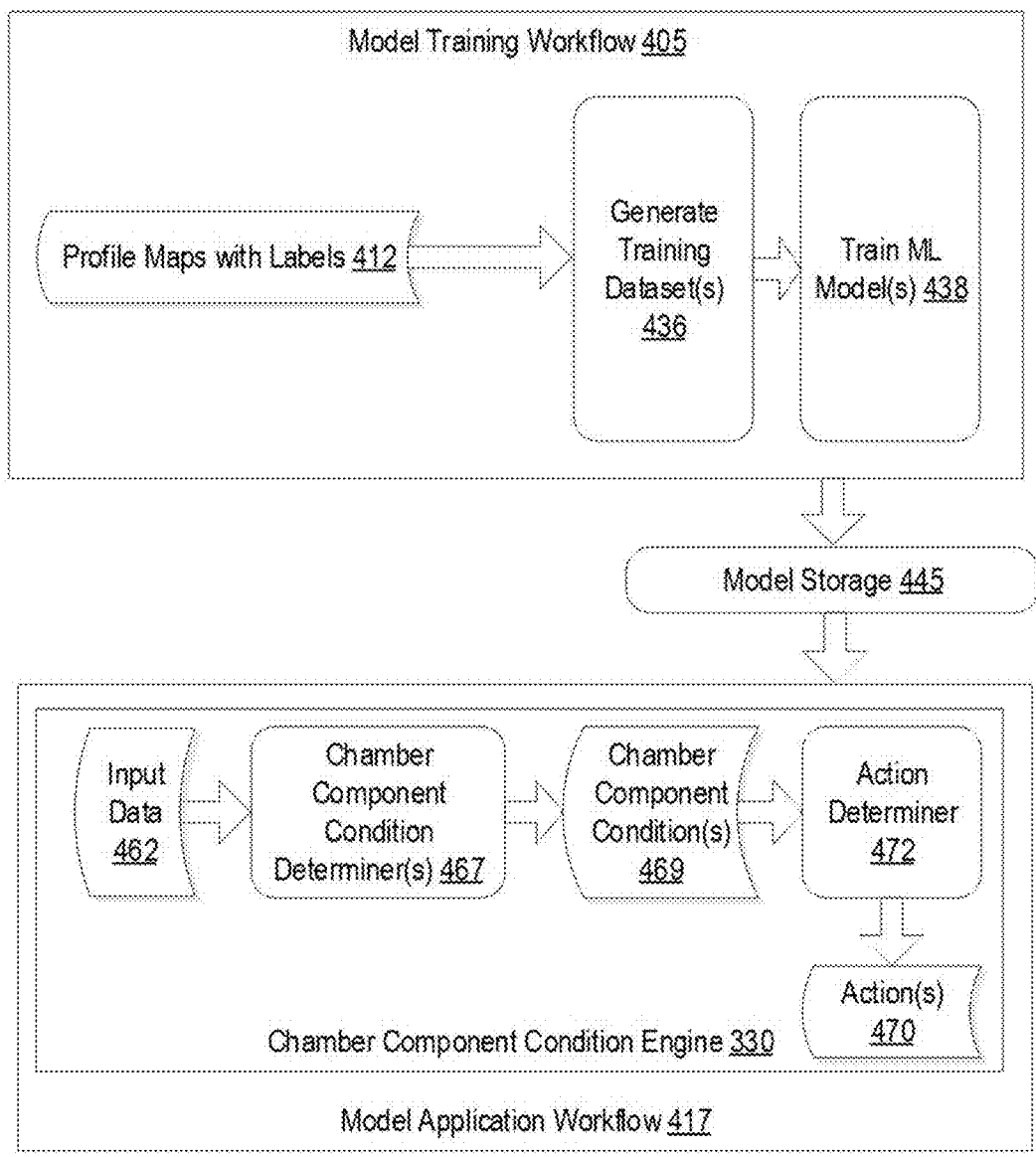
FIG. 4 illustrates a model training workflow and a model application workflow for chamber component condition determination, according to one embodiment.

FIG. 4 illustrates a model training workflow 405 and a model application workflow 417 for chamber component condition assessment according to one embodiment. Model training workflow 405 and model application workflow 417 may be performed by processing logic executed by a processor of a computing device. One or more of these workflows 405, 417 may be implemented, for example, by one or more machine learning models implemented on a processing device and/or other software and/or firmware executing on a processing device.

The model training workflow 405 is to train one or more machine learning models (e.g., deep learning models) to determine one or more conditions of one or more features and/or regions of one or more chamber components. Model application workflow 417 is to apply the one or more trained machine learning models to perform chamber component condition assessment. Each of profile maps 412 may be associated with one or more labels indicating, for example, an erosion state and/or damage of a seal band, states of one or more mesas (e.g., erosion states and/or presence or absence of mesas), dielectric thicknesses of regions of a substrate support, state of lift pin holes and/or surrounding seal bands (e.g., to identify lift pin hot spots), other component damage or decay, and so on.

Various machine learning outputs are described herein. Particular numbers and arrangements of machine learning models are described and shown. However, it should be understood that the number and type of machine learning models that are used and the arrangement of such machine learning models can be modified to achieve the same or similar end results. Accordingly, the arrangements of machine learning models that are described and shown are merely examples and should not be construed as limiting.

In embodiments, one or more machine learning models are trained to perform one or more chamber component condition estimation tasks. Each task may be performed by a separate machine learning model. Alternatively, a single machine learning model may perform each of the tasks or a subset of the tasks. For example, a first machine learning model may be trained to detect a first condition of a first chamber component, and a second machine learning model may be trained to detect a second condition of the first chamber component. In another example, a first machine learning model may be trained to detect one or more condition of a first chamber component, and a second machine learning model may be trained to detect one or more condition of a second chamber component. Additionally, or alternatively, different machine learning models may be trained to perform different combinations of the tasks. In an example, one or a few machine learning models may be trained, where the trained machine learning (ML) model is a single shared neural network that has multiple shared layers and multiple higher level distinct output layers, where each of the output layers outputs a different prediction, classification, identification, etc. For example, a first higher level output layer may determine a chamber component condition for a first type of chamber component (e.g., electrostatic chuck) and a second higher level output layer may determine a chamber component condition for a second type of chamber component (e.g., showerhead).

One type of machine learning model that may be used to perform some or all of the above tasks is an artificial neural network, such as a deep neural network. Artificial neural networks generally include a feature representation component with a classifier or regression layers that map features to a target output space. A convolutional neural network (CNN), for example, hosts multiple layers of convolutional filters. Pooling is performed, and non-linearities may be addressed, at lower layers, on top of which a multi-layer perceptron is commonly appended, mapping top layer features extracted by the convolutional layers to decisions (e.g. classification outputs). Deep learning is a class of machine learning algorithms that use a cascade of multiple layers of nonlinear processing units for feature extraction and transformation. Each successive layer uses the output from the previous layer as input. Deep neural networks may learn in a supervised (e.g., classification) and/or unsupervised (e.g., pattern analysis) manner. Deep neural networks include a hierarchy of layers, where the different layers learn different levels of representations that correspond to different levels of abstraction. In deep learning, each level learns to transform its input data into a slightly more abstract and composite representation. Notably, a deep learning process can learn which features to optimally place in which level on its own. The "deep" in "deep learning" refers to the number of layers through which the data is transformed. More precisely, deep learning systems have a substantial credit assignment path (CAP) depth. The CAP is the chain of transformations from input to output. CAPs describe potentially causal connections between input and output. For a feedforward neural network, the depth of the CAPs may be that of the network and may be the number of hidden layers plus one. For recurrent neural networks, in which a signal may propagate through a layer more than once, the CAP depth is potentially unlimited.

Training of a neural network may be achieved in a supervised learning manner, which involves feeding a training dataset consisting of labeled inputs through the network, observing its outputs, defining an error (by measuring the difference between the outputs and the label values), and using techniques such as deep gradient descent and back-propagation to tune the weights of the network across all its layers and nodes such that the error is minimized. In many applications, repeating this process across the many labeled inputs in the training dataset yields a network that can produce correct output when presented with inputs that are different than the ones present in the training dataset.

For model training workflow 405, a training dataset containing hundreds, thousands, tens of thousands, hundreds of thousands or more profile maps 412 of a substrate should be used to form a training dataset. Data may include, for example, a uniformity profile determined using a given number of measurements each associated with a particular target position. This data may be processed to generate one or more training datasets 436 for the training of one or more machine learning models. Training data items in training datasets 436 may include profile maps 412, labels indicating chamber component conditions of chamber components used to process substrates that were measured to generate the profile maps, one or more images of the substrates, and/or age information about the one or more chamber components that were used to process the substrates.

To effectuate training, processing logic inputs the training dataset(s) 436 into one or more untrained machine learning models. Prior to inputting a first input into a machine learning model, the machine learning model may be initialized. Processing logic trains the untrained machine learning model(s) based on the training dataset(s) to generate one or more trained machine learning models that perform various operations as set forth above. Training may be performed by inputting input data such as one or more profile maps 412 (e.g., thickness profile maps, spectra profile maps, roughness profile maps, particle count profile maps, optical constant profile maps, etc.), images and/or age information of components into the machine learning one at a time.

The machine learning model processes the input to generate an output. An artificial neural network includes an input layer that consists of values in a data point. The next layer is called a hidden layer, and nodes at the hidden layer each receive one or more of the input values. Each node contains parameters (e.g., weights) to apply to the input values. Each node therefore essentially inputs the input values into a multivariate function (e.g., a non-linear mathematical transformation) to produce an output value. A next layer may be another hidden layer or an output layer. In either case, the nodes at the next layer receive the output values from the nodes at the previous layer, and each node applies weights to those values and then generates its own output value. This may be performed at each layer. A final layer is the output layer, where there is one node for each class, prediction and/or output that the machine learning model can produce.

Accordingly, the output may include one or more predictions or inferences (e.g., estimations of chamber component conditions for one or more regions or features of one or more chamber components of a process chamber in which a measured substrate was processed). Processing logic may compare the output estimated chamber component condition(s) against label chamber component condition(s). Processing logic determines an error (i.e., a classification error) based on the differences between the estimated chamber component condition(s) and the target chamber component condition(s). Processing logic adjusts weights of one or more nodes in the machine learning model based on the error. An error term or delta may be determined for each node in the artificial neural network. Based on this error, the artificial neural network adjusts one or more of its parameters for one or more of its nodes (the weights for one or more inputs of a node). Parameters may be updated in a back propagation manner, such that nodes at a highest layer are updated first, followed by nodes at a next layer, and so on. An artificial neural network contains multiple layers of "neurons", where each layer receives as input values from neurons at a previous layer. The parameters for each neuron include weights associated with the values that are received from each of the neurons at a previous layer. Accordingly, adjusting the parameters may include adjusting the weights assigned to each of the inputs for one or more neurons at one or more layers in the artificial neural network.

Once the model parameters have been optimized, model validation may be performed to determine whether the model has improved and to determine a current accuracy of the deep learning model. After one or more rounds of training, processing logic may determine whether a stopping criterion has been met. A stopping criterion may be a target level of accuracy, a target number of processed images from the training dataset, a target amount of change to parameters over one or more previous data points, a combination thereof and/or other criteria. In one embodiment, the stopping criteria is met when at least a minimum number of data points have been processed and at least a threshold accuracy is achieved. The threshold accuracy may be, for example, 70%, 40% or 90% accuracy. In one embodiment, the stopping criterion is met if accuracy of the machine learning model has stopped improving. If the stopping criterion has not been met, further training is performed. If the stopping criterion has been met, training may be complete. Once the machine learning model is trained, a reserved portion of the training dataset may be used to test the model. Once one or more trained machine learning models 438 are generated, they may be stored in model storage 445, and may be added to chamber component condition engine 330.

For model application workflow 417, according to one embodiment, input data 462 may be input into one or more chamber component condition determiners 467, each of which may include a trained neural network, a statistical model, a physics-based model, and so on. Additionally, or alternatively, one or more chamber component condition determiner 467 may apply image processing algorithms to determine chamber component conditions. The input data may include a profile map (e.g., of a polymer layer on a substrate measured using an integrated reflectometry device or substrate measurement system, of a stack of patterned layers, etc.) that was generated based on measurement of a substrate that was processed using a process chamber. The process chamber may include new and/or used components (e.g., may include a new and/or used substrate support, process kit ring, gas delivery plate, and so on). The input data may additionally optionally include one or more images of the substrate and/or age information (e.g., number of hours of use, number of substrates processed) for one or more chamber components of a process chamber used to process the substrate.

Based on input data 462, chamber component condition determiner(s) 467 output one or more estimated chamber component conditions 469. The estimated chamber component conditions may include chamber component conditions for one or multiple chamber components (which may be new or used), such as an electrostatic chuck or other substrate support, a gas delivery plate, a showerhead, another gas-delivery device, a process kit ring, and so on. Multiple chamber component conditions may be determined for a single chamber component. For example, mesa conditions, seal band conditions and lift pin location conditions (e.g., for lift pin location relative to where the substrate was placed within the process chamber) may all be determined for an electrostatic chuck or other substrate support.

The estimated mesa condition may include an estimation of an amount of erosion for one or more mesas of the substrate support, an estimation of missing mesas (e.g., for a new or used substrate support), an estimation of a mesa pattern (e.g., for a new or used substrate support), an estimation of a degree to which the estimated mesa pattern deviates from a target mesa pattern (e.g., for a new or used substrate support), and so on. The estimated seal band condition may include an estimation of erosion for one or more portions of the seal band of the substrate support, an estimation of a concentricity of the seal band, and so on. The estimated lift pin location condition may include an estimation of hot spots at one or more locations of the substrate support, an estimation of lift pin locations, an estimation of a deviation of the estimated lift pin locations from target lift pin locations, and so on. The process kit ring may surround a substrate support and/or be positioned beneath a substrate support. The process kit ring condition estimation for the process kit ring may include an estimation of erosion for the process kit ring, an estimation of a defect in the process kit ring (e.g., amount to which the process kit ring is out-of-round), an estimation of a missing process kit ring, and so on.

In some embodiments, chamber component condition determiner(s) 467 includes one or more models that receive input data 462 (e.g., a profile map of a substrate processed by a process chamber) and output chamber component conditions 469 and/or proposed adjustments to one or more chamber components of the process chamber that compensate for current chamber component conditions 469. The model(s) may be or include trained machine learning models (e.g., convolutional neural networks), tables that associate profile map data to recipe and/or equipment settings, physics-based models (e.g., a digital twin) that associate profile map data to recipe and/or equipment settings, and so on. The model(s) may output recommended adjustments for one or more parameters of a recipe used to process the substrate associated with a profile map that was input into the model(s). Additionally, or alternatively, the model(s) may output recommended settings for one or more parameters of a recipe used to process the substrate associated with a profile map that was input into the model(s). Additionally, or alternatively, the model(s) may output recommended settings for one or more chamber components (e.g., chamber parameter settings) used to process the substrate associated with a profile map that was input into the model(s). Additionally, or alternatively, the model(s) may output recommended settings for parameters of one or more tools (tool parameter settings), which may include chamber parameter settings and/or settings of tools external to a process chamber. Such tools that are external to a process chamber may be connected to multiple different process chambers. Examples of external tools include abatement, gas supplies, vacuum pumps, and so on. Such settings may be tool parameter settings (e.g., equipment settings) that are not associated with any particular recipes, such as an amount of power to deliver to a heating element to achieve a target temperature, a valve setting to achieve a target flow rate, and so on. Examples of recipe settings that may be adjusted or controlled based on the output of the model(s) include one or more plasma power settings, one or more temperature set points (e.g., for various zones of a multi-zone heater or chuck), one or more process step durations, one or more gas delivery flow rates, pressure, and so on.

An action determiner 472 may determine based on the chamber component condition(s) 469 one or more actions 470 to perform. In one embodiment, action determiner 472 compares the chamber component condition estimations to one or more chamber component condition thresholds or other criteria. If one or more of the chamber component condition estimations meets or exceeds a chamber component condition threshold or other criteria, then action determiner 472 may determine that preventative maintenance is recommended, and may output a recommendation or notification to schedule maintenance and/or replacement of one or more chamber components of a process chamber. Alternatively, action determiner 472 may output one or more design variation recommendations for modifying a chamber component (e.g., to alleviate lift pin hot spots). Alternatively, or additionally, action determiner 472 may output one or more suggestions for recipe adjustments, for settings adjustments of one or more chamber components, and so on.

In some embodiments, action determiner 472 automatically schedules maintenance of a process chamber based on chamber component conditions 469 meeting one or more maintenance criteria. For example, chamber component conditions may include an estimate of amount of erosion or wear on a seal band of a substrate support, on mesas for one or more regions of the substrate support, and/or around lift pin holes of a substrate support. Chamber component conditions may further include present or missing mesas. Chamber component conditions may further include dielectric layer thickness of a substrate support (e.g., an electrostatic chuck). Chamber component conditions may further include a bond delamination state. The amount of erosion or wear for each region or feature may be compared to an erosion threshold. If the erosion exceeds an erosion threshold, then maintenance may be recommended or triggered. Additionally, if one or more mesas are missing, then replacement of a puck for an electrostatic chuck may be recommended or triggered. Additionally, if one or more regions of an electrostatic chuck are determined to have a dielectric layer that is less than a target dielectric layer thickness, then replacement of a puck of the electrostatic chuck may be recommended or triggered.

In some embodiments, action determiner 472 may output one or more recipe adjustments (e.g., suggestions for one or more recipe adjustments) and/or adjustments to the settings or positions of one or more chamber components to compensate for the chamber component condition estimations. Such adjustments may be automatically made by action determiner 472 in some embodiments. For example, if an edge seal band of a substrate support is eroding (e.g., an estimated seal band erosion value falls within a value range associated with a particular amount of erosion), then to maintain substrate chucking a chucking voltage can be increased (e.g., to an amount associated with the value range). In another example, if mesas are worn (e.g., an estimated mesa erosion value falls within a value range associated with a particular amount of erosion), then a backside cooling gas pressure may be reduced to compensate for the worn mesas (e.g., to an amount associated with the value range). In another example, if process kit erosion is detected (e.g., an estimated process kit ring erosion value falls within a value range associated with a particular amount of erosion), then a height of the process kit ring can be adjusted to compensate (e.g., to an amount associated with the value range). This enables closed loop control of process recipes based on detected chamber component conditions.

In some embodiments, action determiner 472 determines one or more actions to perform based on suggested recipe set points or parameters, equipment set points, and so on output by chamber component condition determiner(s) 467.

Examples of actions that may be performed include adjusting a set point of a chamber component, adjusting a parameter value for one or more step of a process recipe run on the process chamber, and so on. Accordingly, in embodiments the chamber component condition engine 330 may perform closed loop process control, feedforward process control, feedback process control, and so on.

In one embodiment, action determiner 472 includes a quality assessor, which may perform one or more tests or checks to determine a quality of one or more chamber components. The quality assessor may determine whether chamber component conditions satisfy one or more lift pin criteria, one or more seal band criteria, one or more mesa criteria, one or more delamination criteria, one or more process kit ring criteria, and so on. For example, a seal band criterion may include a concentricity to the substrate support threshold. If a detected concentricity to the substrate support fails to meet the concentricity threshold, then the seal band criterion may not be met. In another example, a mesa criterion may include a mesa presence criterion. If any mesa is detected to be missing, then the mesa presence criterion may not be satisfied. In another example, a mesa pattern may be determined and compared to a target mesa pattern. If the determined mesa pattern deviates from the target mesa pattern by more than a threshold amount, then the mesa pattern criterion may not be satisfied. In another example, a process kit ring presence may be detected. If the process kit ring is determined to be missing, then a process kit ring presence criterion may not be satisfied. In another example, a process kit ring, mesa, and/or seal band erosion value may be determined and compared to process kit ring, mesa and/or seal band erosion thresholds. If any of the detected erosion amounts exceeds a respective erosion threshold, then an erosion criterion may not be satisfied. In another example, a delamination amount may be determined for the substrate support (indicating an amount of delamination between layers of the substrate support). If the delamination amount exceeds a delamination threshold, then a delamination criterion may not be satisfied. If any of these quality criteria are not satisfied, then appropriate action may be taken by action determiner 472.

In one embodiment, the action determiner 472 determines a quality metric value for the process chamber and/or for one or more chamber components of the process chamber. The quality metric value may be based on one or more chamber component conditions, whether one or more chamber components passed respective tests and/or test scores of chamber components. The quality metric value may indicate a quality of the process chamber and/or of an individual chamber component. In one embodiment, action determiner 472 may determine whether a chamber component (e.g., a substrate support) will cause a reduction in product quality based on the quality metric value and/or on chamber component condition estimates (e.g., an estimated mesa condition, an estimated lift pin condition, and estimated seal band condition, etc.). If the chamber component will cause a reduction in product quality (e.g., an increased fail rate for devices), processing logic may determine that maintenance should be performed to replace or refurbish the chamber component.

In one embodiment, action determiner 472 compares the chamber component conditions to one or more previous chamber component conditions for chamber components of a chamber. Based on such a comparison, action determiner 472 may determine a change and/or a rate of change of one or more chamber component conditions (e.g., an erosion rate for one or more regions of a substrate support). Based on the change or rate of change, action determiner 472 may determine one or more actions to perform. In one embodiment, based on the rate of change of a chamber component and the current state of the chamber component, processing logic may determine when to perform maintenance on the chamber component.

In one embodiment, action determine 472 compares the chamber component conditions to a curve. The curve may be a curve of chamber component conditions for one or more chamber components of a process chamber over time. Based on where the chamber component conditions fall on the curve, action determiner 472 may determine one or more actions to perform.

Figure 5:
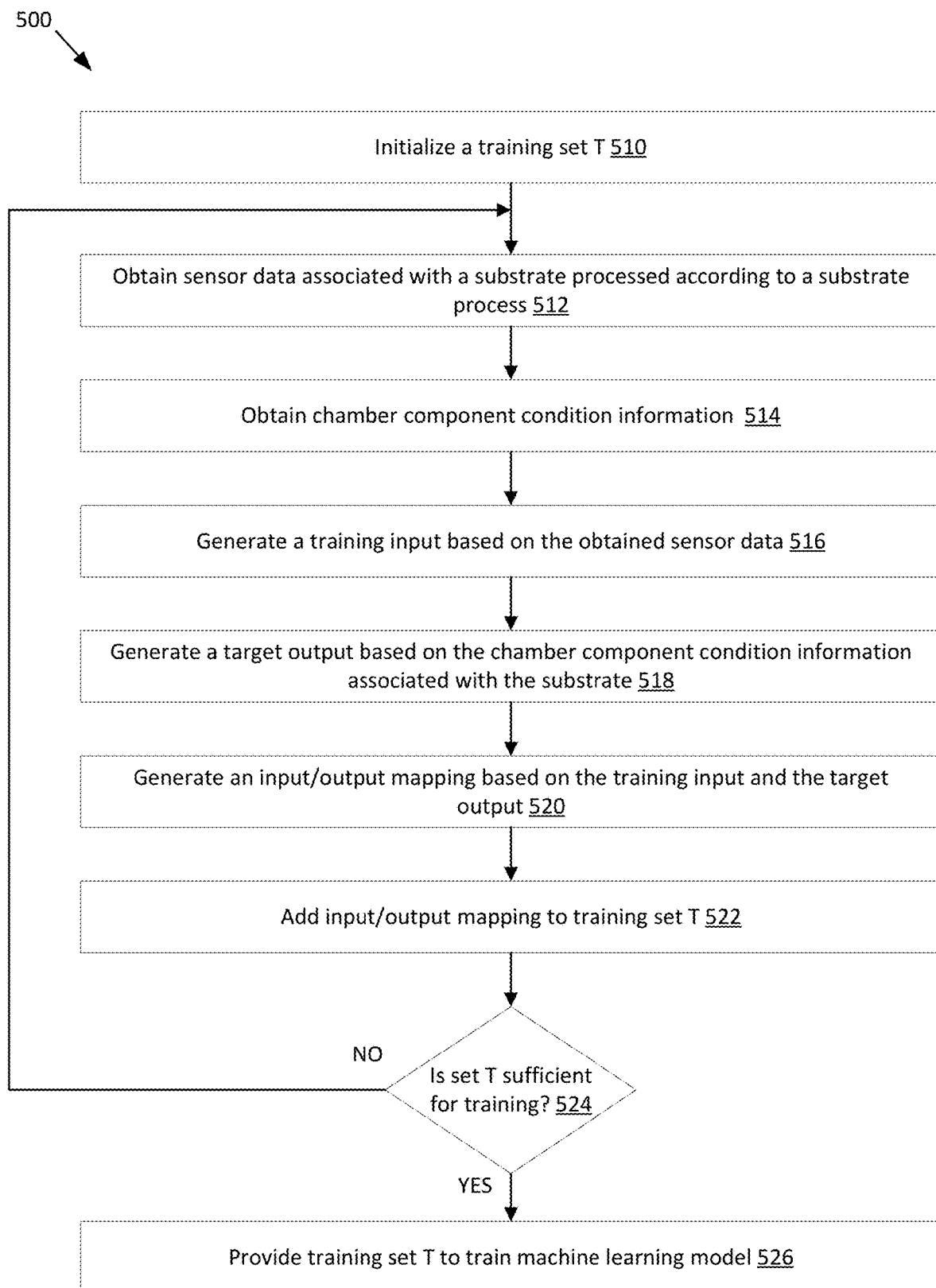
FIG. 5 is a flow chart of a method for generating a training dataset for training a machine learning model, according to aspects of the present disclosure.

FIG. 5 is a flow chart of a method 500 for generating a training dataset for training a machine learning model to perform chamber component condition assessments, according to aspects of the present disclosure. Method 500 is performed by processing logic that can include hardware (circuitry, dedicated logic, etc.), software (such as is run on a general purpose computer system or a dedicated machine), firmware, or some combination thereof. In one implementation, method 500 can be performed by a computer system, such as computer system architecture 100 of FIG. 1. In other or similar implementations, one or more operations of method 500 can be performed by one or more other machines not depicted in the figures. In some aspects, one or more operations of method 500 can be performed by training set generator 324 of server machine 320 or server machine 350, described with respect to FIG. 3.

At block 510, processing logic initializes a training set T to an empty set (e.g., { }). At block 512, processing logic obtains substrate surface data (e.g., reflectometry data of a surface of a film on a substrate, such as a film thickness profile map or wafer map) associated with a substrate processed at a process chamber of a manufacturing system.

At block 514, processing logic obtains chamber component condition information for the process chamber that processed the substrate. As described previously, the chamber component condition information may include erosion information on one or more features of a substrate support, information on the condition of one or more features of a showerhead (e.g., gas delivery rates and/or quantities for one or more regions of a showerhead), and so on.

At block 516, processing logic generates a training input based on the sensor data obtained for the substrate at block 512. In some embodiments, the training input can include a normalized set of sensor data (e.g., including surface reflectometer data as described herein).

At block 518, processing logic can generate a target output based on the chamber component condition information obtained at block 514. The target output can correspond to chamber component condition metrics (data indicative of conditions of features for one or more chamber components) of a process chamber the processed the substrate.

At block 520, processing logic generates an input/output mapping. The input/output mapping refers to the training input that includes or is based on data for the substrate, and the target output for the training input, where the target output identifies a chamber component condition, and where the training input is associated with (or mapped to) the target output. At block 522, processing logic adds the input/output mapping to the training set T.

At block 524, processing logic determines whether the training set, T, includes a sufficient amount of training data to train a machine learning model. It should be noted that in some implementations, the sufficiency of training set T can be determined based simply on the number of input/output mappings in the training set, while in some other implementations, the sufficiency of training set T can be determined based on one or more other criteria (e.g., a measure of diversity of the training examples, etc.) in addition to, or instead of, the number of input/output mappings. Responsive to determining the training set, T, includes a sufficient amount of training data to train the machine learning model, processing logic provides the training set, T, to train the machine learning model. Responsive to determining the training set does not include a sufficient amount of training data to train the machine learning model, method 500 returns to block 512.

At block 526, processing logic provides the training set T to train the machine learning model. In some embodiments, the training set T is provided to training engine 326 of server machine 320 and/or server machine 350 to perform the training. In the case of a neural network, for example, input values of a given input/output mapping (e.g., spectral data and/or chamber data for a previous substrate) are input to the neural network, and output values of the input/output mapping are stored in the output nodes of the neural network. The connection weights in the neural network are then adjusted in accordance with a learning algorithm (e.g., backpropagation, etc.), and the procedure is repeated for the other input/output mappings in the training set T. After block 526, machine learning model 190 can be used to provide chamber component conditions (e.g., chamber condition metrics) for chamber components of process chambers.

Figure 6:
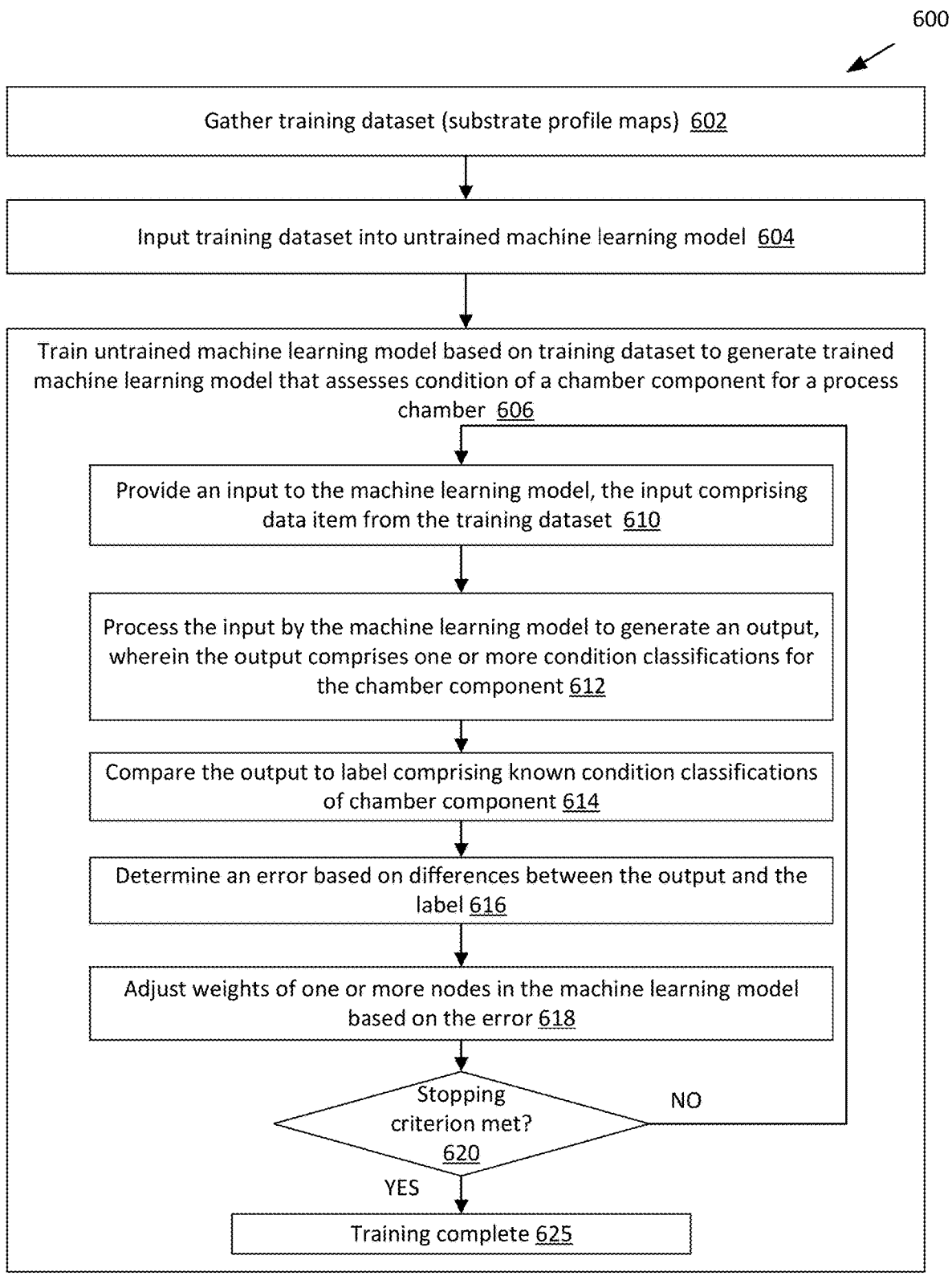
FIG. 6 illustrates a flow diagram for a method of training a machine learning model to determine a condition of a chamber component, in accordance with one embodiment.

FIG. 6 is a flow chart illustrating an embodiment for a method 600 of training a machine learning model to estimate conditions of one or more chamber components of a process chamber. Method 600 is performed by processing logic that can include hardware (circuitry, dedicated logic, etc.), software (such as is run on a general purpose computer system or a dedicated machine), firmware, or some combination thereof. In one implementation, method 600 can be performed by a computer system, such as computer system architecture 100 of FIG. 1. In other or similar implementations, one or more operations of method 600 can be performed by one or more other machines not depicted in the figures. In some aspects, one or more operations of method 600 can be performed by training engine 326 of server machine 320 or server machine 350, described with respect to FIG. 3.

At block 602 of method 600, processing logic gathers a training dataset, which may include data from a plurality of film profile maps (e.g., film thickness profile maps indicating film thickness of a polymer film for a plurality of locations on a substrate). Each data item of the training dataset may include one or more labels. The data items in the training dataset may include input-level (e.g., image-level) labels that indicate a presence or absence of one or more chamber component conditions without identifying coordinates associated with the chamber component conditions. For example, some data items may include a label of a worn seal band, some data items may include a label of worn mesas, and some data items may include a label of no adverse chamber component conditions. The data items in the training dataset may also include other labels, such as coordinate-level (e.g., pixel-level) classifications of chamber conditions. In embodiments, each data item includes a feature vector that includes thickness values for each of a plurality of substrate coordinates. In some embodiments, each data item includes a wafer map, which may be an image of a wafer (e.g., a heat map of a wafer). Colors in the heat map may indicate film thickness or other parameter values. Alternatively, actual thickness values may be used for each of many coordinates on the surface of a substrate (e.g., of a wafer). A label may be or include a mask that comprises coordinate-level labels, where each coordinate may be associated with one or more labels, such as an erosion value, a pass or fail value, one or more particular chamber component condition classifications, and so on.

At block 604, data items from the training dataset are input into the untrained machine learning model. At block 606, the machine learning model is trained based on the training dataset to generate a trained machine learning model that classifies or estimates one or more chamber component conditions for one or more chamber components of a process chamber. The machine learning model may also be trained to output one or more other types of predictions, coordinate-level classifications, decisions, and so on.

In one embodiment, at block 610 an input of a training data item is input into the machine learning model. The input may include data from a film profile map (e.g., a wafer map) indicating one or more film properties across the substrate (e.g., thickness, optical constant, particle count, roughness, material property, etc.). The data may be input as an image or as a feature vector in embodiments. At block 612, the machine learning model processes the input to generate an output. The output may include one or more chamber component condition classifications (e.g., worn seal band, worn mesas, worn lift pin holes, worn showerhead gas delivery holes, etc.). The output may additionally or alternatively include one or more coordinate-level chamber component condition classifications. For example, the output may indicate a wear value or erosion value for each coordinate of a substrate. The output may indicate wear or erosion values for one or more regions of a substrate support that supported the substrate during processing in some embodiments. For example, the output may indicate amounts of erosion or wear for each coordinate of the substrate support (e.g., of an electrostatic chuck). The output may include, for each chamber component condition class that the machine learning model is being trained to identify, a probability of the chamber component condition class being present.

At block 614, processing logic compares the output probabilities and/or values of chamber component conditions to a label of one or more chamber component conditions associated with the input. At block 616, processing logic determines an error based on differences between the output and the label. At block 618, processing logic adjusts weights of one or more nodes in the machine learning model based on the error.

At block 620, processing logic determines if a stopping criterion is met. If a stopping criterion has not been met, the method returns to block 610, and another training data item is input into the machine learning model. If a stopping criterion is met, the method proceeds to block 625, and training of the machine learning model is complete.

In one embodiment, multiple different ML models are trained to identify different types of chamber component conditions and/or to identify chamber component conditions for different types of chamber components.

In one embodiment, one or more ML models are trained for application across multiple process chambers, which may be a same type or model of process chamber. A trained ML model may then be further tuned for use for a particular instance of a process chamber. The further tuning may be performed by using additional training data items comprising film thickness profile maps of substrates processed by the process chamber in question. Such tuning may account for chamber mismatch between chambers and/or specific hardware process kits of some process chambers. Additionally, in some embodiments, further training is performed to tune an ML model for a process chamber after maintenance on the process chamber and/or one more changes to hardware of the process chamber.

Figure 7:
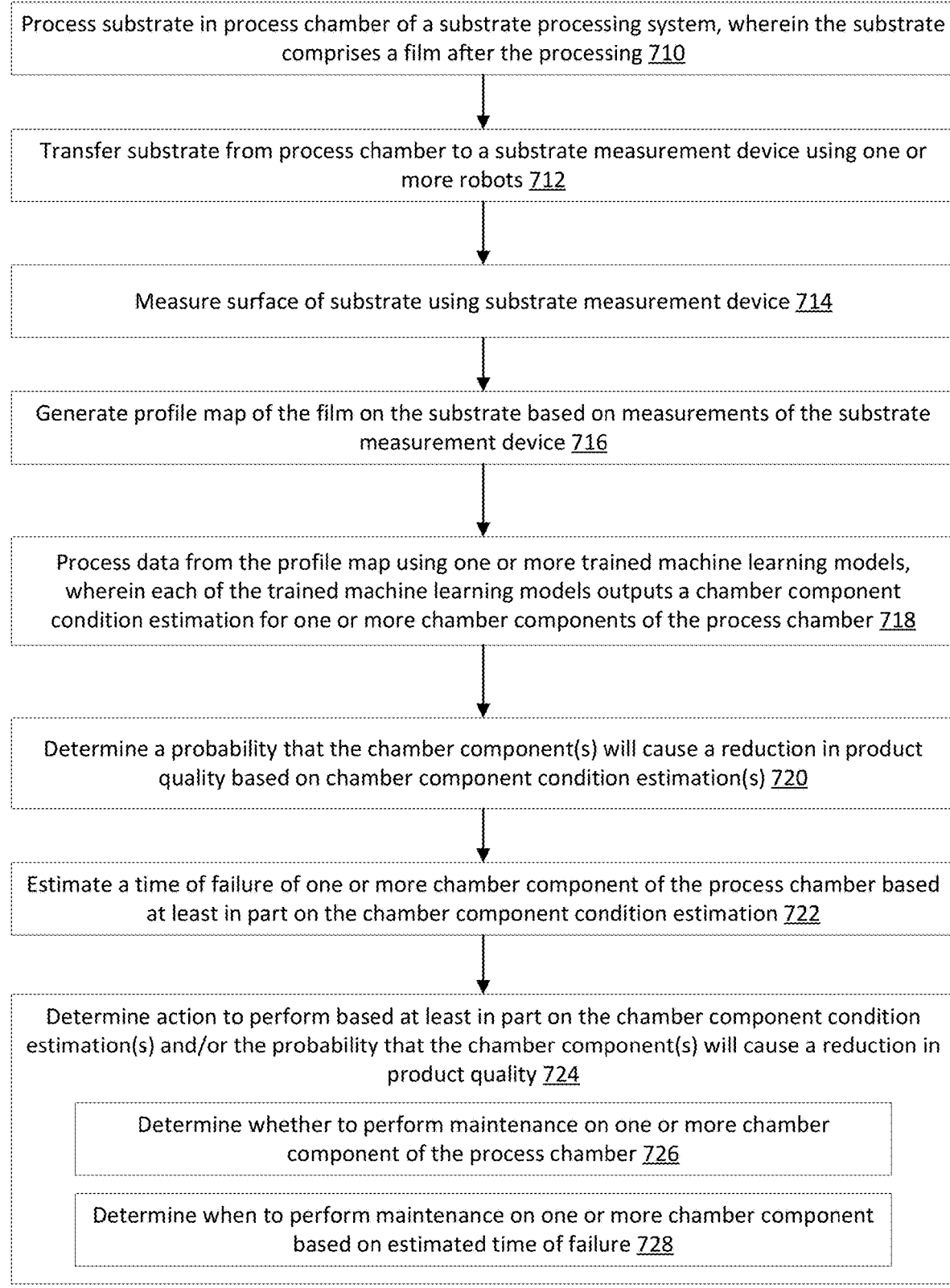
FIG. 7 is a flow diagram for a method of determining chamber conditions of one or more chamber components using one or more trained machine learning models, according to aspects of the present disclosure.

FIG. 7 is a flow diagram for a method 700 of determining chamber conditions of one or more chamber components using one or more trained machine learning models, according to aspects of the present disclosure. Method 700 is performed by processing logic that can include hardware (circuitry, dedicated logic, etc.), software (such as is run on a general purpose computer system or a dedicated machine), firmware, or some combination thereof. In one implementation, method 700 can be performed by a computer system, such as computer system architecture 100 of FIG. 1. In other or similar implementations, one or more operations of method 700 can be performed by one or more other machines not depicted in the figures. In some aspects, one or more operations of method 700 can be performed by chamber component condition engine 330 of server machine 320, described with respect to FIG. 3.

At block 710 of method 700, a process chamber of a substrate processing system (also referred to as a manufacturing system) processes a substrate. For example, the process chamber may perform a film deposition process to deposit a film on the substrate or an etch process to partially remove a film on the substrate. In some embodiments, the film is a polymer. In other embodiments, the film is a ceramic (e.g., a metal oxide).

At block 712, one or more robots transfers the substrate from the process chamber to a substrate measurement system. If the substrate measurement system is connected to or included in a transfer chamber, then a transfer chamber robot may remove the substrate from the process chamber and insert the substrate into the substrate measurement system. If the substrate measurement system is connected to or included in a factory interface, then a transfer chamber robot may remove the substrate from the process chamber and place the substrate in a load lock. A factory interface robot may then remove the substrate from the load lock and insert the substrate into the substrate measurement system. The substrate measurement system may be any of the aforementioned substrate measurement systems, such as an integrated reflectometry (IR) device.

At block 714, the substrate measurement system generates measurements of many locations on a surface of the substrate. Each location may have a unique set of coordinates. At block 716, the substrate measurement system and/or a computing device may generate one or more profile map of the film on the substrate based on the measurements of the substrate measurement system. The profile map(s) may be or include an image, where each pixel in the image corresponds to a coordinate on the substrate. Each pixel may have an intensity value that corresponds to a measurement value (e.g., thickness value) at the coordinate of the substrate associated with the pixel. The profile may be or include a feature vector, where each entry in the feature vector is associated with a coordinate of the substrate, and where each entry may have a value that represents a value of the film at the coordinate of the substrate.

At block 718, a computing device processes the profile map or maps (e.g., thickness profile map, particle map, optical constant map, roughness map, etc.) using one or more trained machine learning models. Each of the trained machine learning models outputs one or more chamber component condition estimation for one or more chamber components of the process chamber. The output may include image-level or component-level chamber component estimates. For example, the output may indicate that wear of an electrostatic chuck is detected, or that wear of a showerhead is detected. The output may include classifications of one or more chamber component conditions. For example, the output may indicate that seal band erosion, mesa erosion, dielectric layer erosion, lift pin hole erosion, etc. is detected. The output may provide values for one or more chamber component conditions, such as an amount of seal band erosion, an amount of mesa erosion, an amount of lift pin hole erosion, and so on. In some embodiments, the output includes coordinate-level or region-level classifications of chamber component conditions for a chamber component. For example, the output may indicate, for various coordinates on a substrate support, erosion values, bond erosion values, dielectric thicknesses, planarity of a surface of the substrate support, concentricity of elements on a surface of the substrate support, roughness of the surface of the substrate support, existence and/or size of valleys or grooves in the surface of the substrate support and/or chamber condition classifications identified for those coordinates. This may enable a user to determine what regions on chamber components are worn or problematic.

In one embodiment, rather than or in addition to using a trained ML model, one or more computer vision algorithms are used to process the profile map(s). In one embodiment, a gold standard or reference film profile map associated with a healthy process chamber component is compared to the generated profile map. Differences may be determined between the reference film profile map and the generated film map based on the comparison. Different types of differences may be associated with different chamber component condition classifications. For example, the reference film profile map may include representation of a circle or bump that represents a mesa, and an absence of a similar circle or bump in the generated film profile map may indicate that an electrostatic chuck is missing a mesa. The comparison may be a full image comparison between the reference film profile map and the generated film profile map. Alternatively, the comparison may be between patches or regions of the generated film profile map and a patch or region of a reference film profile map (e.g., for feature mapping).

In one embodiment, at block 720 processing logic of the computing device determines a probability that a chamber component (or multiple chamber components) will cause a reduction in product quality, product scrap, processing delay, and so on based on the output of the machine learning model. In one embodiment, at block 722 processing logic estimates a time of failure of one or more chamber components of the process chamber based at least in part on the output of the machine learning model (e.g., based on the chamber component condition estimation).

At block 724, processing logic determines one or more actions to perform based at least in part on the chamber component condition estimations and/or on the probability that the chamber components will cause a reduction in product quality. The actions may include generating a notice, recommending maintenance, scheduling maintenance, recommending or scheduling part replacement for one or more chamber components, recommending or scheduling refurbishment of one or more chamber components, and so on. In one embodiment, processing logic determines whether maintenance should be performed on one or more chamber component of the process chamber at block 726. The determination may then be output in a notification. In one embodiment, processing logic determines when to perform maintenance on one or more chamber component based on the estimated time of failure.

In one embodiment, processing logic generates an image of a chamber component and outputs the image to a graphical user interface. The image may indicate various locations of a chamber component and label one or more regions with chamber component condition classifications. For example, the image may include one or more visualizations that indicates worn or missing mesas, regions of a seal band that are worn, regions of a surface of an electrostatic chuck with a dielectric thickness that is less than a threshold thickness, and so on. The generated image may show estimated dielectric layer thicknesses and/or other properties across a surface of an electrostatic chuck, may show mesa and/or seal band thicknesses across the surface of the electrostatic chuck, and so on. If hot spots are identified around lift pin holes, such hot spots may be shown in the image. Thus, a graphical representation of an electrostatic chuck may be provided that shows diagnostics information about the electrostatic chuck. From the image a user may distinguish lift pin positions, mesa positions and/or thicknesses, seal band positions and/or thicknesses, dielectric layer thicknesses, bond thicknesses, and so on. The image may also identify cracks, thermal distributions, and so on.

Accordingly, in embodiments method 700 may be executed to perform health diagnostics and/or anomaly detection for one or more chamber components, such as for electrostatic chucks. Embodiments are capable of identifying subtle signs of issues in one or more chamber components and provide actions to take to address the issues before they impact product.

Figure 8:
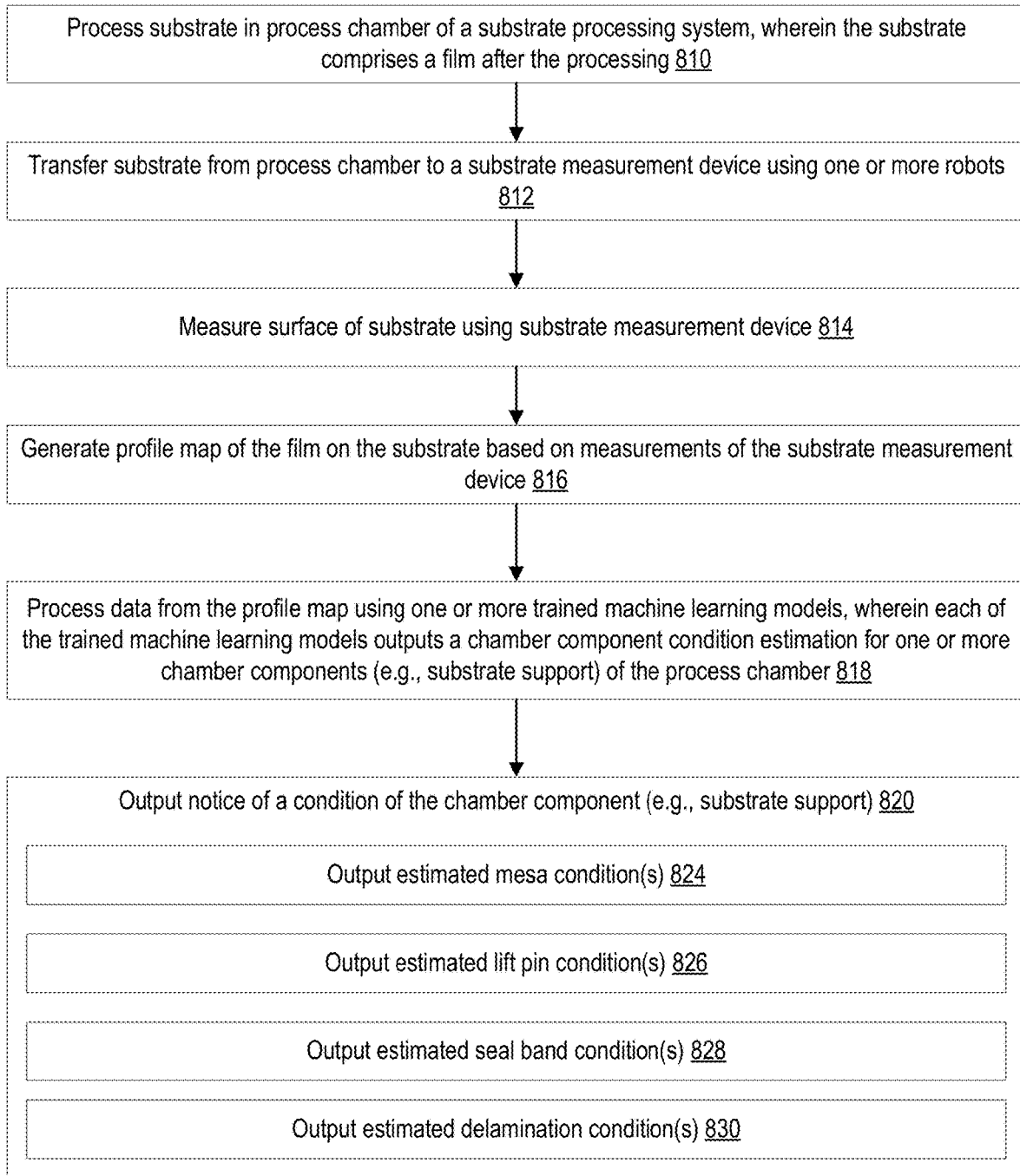
FIG. 8 is a flow diagram for a method of determining chamber conditions of one or more chamber components using one or more trained machine learning models, according to aspects of the present disclosure.

FIG. 8 is a flow diagram for a method 800 of determining conditions of one or more chamber components using one or more models (e.g., one or more trained machine learning models), according to aspects of the present disclosure. Method 800 is performed by processing logic that can include hardware (circuitry, dedicated logic, etc.), software (such as is run on a general purpose computer system or a dedicated machine), firmware, or some combination thereof. In one implementation, method 800 can be performed by a computer system, such as computer system architecture 100 of FIG. 1. In other or similar implementations, one or more operations of method 800 can be performed by one or more other machines not depicted in the figures. In some aspects, one or more operations of method 800 can be performed by chamber component condition engine 330 of server machine 320, described with respect to FIG. 3.

At block 810 of method 800, a process chamber of a substrate processing system (also referred to as a manufacturing system) processes a substrate (e.g., such as using an etch process or a deposition process) according to a process recipe. The process may result in a film (e.g., a polymer film) having certain film properties, such as film thickness, dielectric constant, density, and so on. Depending on the process that is performed, the film property or properties may be highly dependent on certain conditions that are to be evaluated. For example, film thickness for some deposition or etch processes may be dependent on temperature. Accordingly, regions of a substrate that have a thicker film may be associated with a greater or lesser temperature during processing, depending on the process. Thus, based on the thickness of the film at different locations on the substrate, inferences can be made about a temperature of the substrate at those different locations during the process. In another example, film thickness at a location may be dependent on an amount of plasma or an energy of plasma reaching the substrate at the location. Thus, based on the thickness of the film at different locations, inferences can be made about an RF field that impacts plasma at those different locations. A process recipe that is used to process the substrate may be a recipe that is designed to cause a maximal change in a film property such as film thickness with a minimal change in a parameter of interest (e.g., temperature, RF field intensity, plasma energy level, etc.).

At block 812, one or more robots may transfer the substrate from the process chamber to a substrate measurement system. If the substrate measurement system is connected to or included in a transfer chamber, then a transfer chamber robot may remove the substrate from the process chamber and insert the substrate into the substrate measurement system. If the substrate measurement system is connected to or included in a factory interface, then a transfer chamber robot may remove the substrate from the process chamber and place the substrate in a load lock. A factory interface robot may then remove the substrate from the load lock and insert the substrate into the substrate measurement system. The substrate measurement system may be any of the aforementioned substrate measurement systems, such as an integrated reflectometry (IR) device.

At block 814, the substrate measurement system generates measurements of many locations on a surface of the substrate. Each location may have a unique set of coordinates. At block 816, the substrate measurement system and/or a computing device may generate one or more profile map of the film on the substrate based on the measurements of the substrate measurement system. The profile map(s) may be or include an image, where each pixel in the image corresponds to a coordinate on the substrate. Each pixel may have an intensity value that corresponds to a measurement value (e.g., thickness value) at the coordinate of the substrate associated with the pixel. The profile may be or include a feature vector, where each entry in the feature vector is associated with a coordinate of the substrate, and where each entry may have a value that represents a value of the film at the coordinate of the substrate. In one embodiment, each value of the film corresponds to a condition during execution of a process on the substrate that was measured. For example, each film thickness measurement may correspond to a temperature of the substrate during processing. In one embodiment, the profile map and information about a correlation between the value of the film property and the condition during processing (e.g., a function that relates film thickness to temperature) are used to generate a new profile map in which each location of the profile map includes a value representing the condition during processing at the location (e.g., each value represents a temperature at the location during processing).

In one embodiment, the substrate measurement device further generates one or more images of the substrate. The images may include, for example, 2D or 3D color images, IR images, near-IR images, ultraviolet images, and so on.

At block 818, a computing device processes the profile map or maps (e.g., thickness profile map, particle map, optical constant map, roughness map, temperature map, etc.) using one or more trained machine learning models. In some embodiments, an input to the machine learning model may include data from the profile map or maps as well as data from one or more images of the substrate. Each of the trained machine learning models outputs one or more chamber component condition estimation for one or more chamber components of the process chamber. The output may include image-level or component-level chamber component estimates.

In one embodiment, the output includes a profile map of a condition of the substrate during processing (e.g., a temperature map of the substrate during processing). Alternatively, such a profile map of the condition of the substrate during processing may have already been generated at block 816 without the user of machine learning (and may have been input into the trained machine learning model).

In some instances, the output of the trained machine learning model includes information about conditions of one or more chamber components. The information may include information about one or multiple parts of a chamber component in some embodiments. In embodiments, the output may include estimated mesa conditions, lift pin location conditions, seal band conditions and/or delamination conditions for an electrostatic chuck or other substrate support. For example, the output may include an indication of detected mesas and their estimated heights and/or amounts of wear, an indication of estimated heights and/or amounts of wear of regions of a seal band, an indication of estimated locations of lift pin hot spots (points that had a temperature that exceeded a temperature threshold during processing), an indication of estimated areas in which plates of an electrostatic chuck are delaminating and/or an estimated amount of delamination at those areas, and so on.

In one embodiment, the one or more profiles maps are input into the trained machine learning model together with one or more images of the substrate. The addition of images may in some instances improve an accuracy of an output of the trained machine learning model.

At block 820, processing logic outputs a notice of one or more conditions of the chamber component (e.g., of the substrate support). This may include outputting estimated mesa conditions 824 (e.g., such as missing mesas, mesas with excessive wear that exceeds a wear threshold, etc.), outputting estimated lift pin conditions 826 (e.g., such as estimated lift pin hot spots), outputting estimated seal band conditions 828 (e.g., such as locations on a seal band that have excessive wear that exceeds a wear threshold), outputting estimated delamination conditions (e.g., such as areas of delamination and/or a degree or level of delamination at those areas), and so on. The output may be provided via a graphical user interface (GUI) in embodiments. In some embodiments, the output may be a message sent to a device (e.g., a mobile device of a user) via a text message, an email, and so on.

Figure 9:
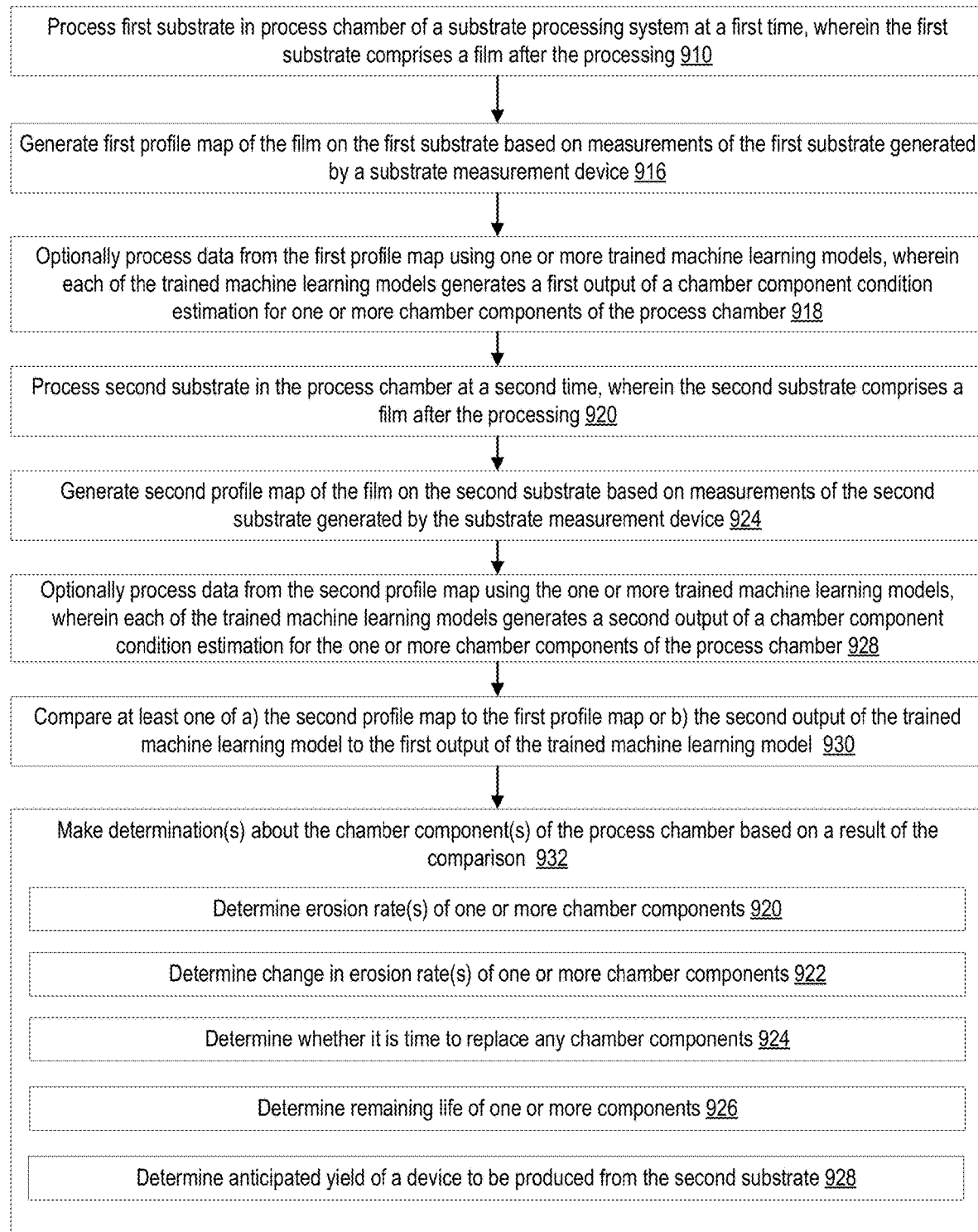
FIG. 9 is a flow diagram for a method of determining chamber conditions of one or more chamber components based on measurements of substrates processed by a process chamber over time, according to aspects of the present disclosure.

FIG. 9 is a flow diagram for a method 900 of determining chamber conditions of one or more chamber components based on measurements of substrates processed by a process chamber over time, according to aspects of the present disclosure. Method 900 is performed by processing logic that can include hardware (circuitry, dedicated logic, etc.), software (such as is run on a general purpose computer system or a dedicated machine), firmware, or some combination thereof. In one implementation, method 900 can be performed by a computer system, such as computer system architecture 100 of FIG. 1. In other or similar implementations, one or more operations of method 900 can be performed by one or more other machines not depicted in the figures. In some aspects, one or more operations of method 900 can be performed by chamber component condition engine 330 of server machine 320, described with respect to FIG. 3.

At block 910 of method 900, a process chamber of a substrate processing system processes a first substrate at a first time according to a process recipe.

At block 916, a substrate measurement system may generate measurements of many locations on a surface of the substrate, and one or more first profile maps of the substrate may be generated from the multiple measurements. The first profile map(s) may be or include, for example, a first thickness map, a first particle map, a first temperature map, a first dielectric constant map, a first optical constant map, a first roughness map, and so on.

At block 918, a computing device may process the first profile map or maps using one or more trained machine learning models. Each of the trained machine learning models outputs one or more first chamber component condition estimation for one or more chamber components of the process chamber. The first output may include image-level or component-level chamber component estimates. In one embodiment, the first output includes a profile map of a condition of the substrate during processing (e.g., a temperature map of the substrate during processing). Alternatively, such a profile map of the condition of the substrate during processing may have already been generated at block 916 without the use of machine learning (and may have been input into the trained machine learning model).

In some instances, the first output of the trained machine learning model includes information about conditions of one or more chamber components. The information may include information about one or multiple parts of a chamber component in some embodiments. In embodiments, the output may include estimated mesa conditions, lift pin location conditions, seal band conditions and/or delamination conditions for an electrostatic chuck or other substrate support.

At block 920, the process chamber of the substrate processing system processes a second substrate at a second time according to the process recipe.

At block 924, the substrate measurement system may generate measurements of many locations on a surface of the second substrate, and one or more second profile maps of the second substrate may be generated from the multiple measurements. The second profile map(s) may be or include, for example, a second thickness map, a second particle map, a second temperature map, a second dielectric constant map, a second optical constant map, a second roughness map, and so on.

At block 928, the computing device may process the second profile map or maps using one or more trained machine learning models. Each of the trained machine learning models outputs one or more second chamber component condition estimation for one or more chamber components of the process chamber. The second output may include image-level or component-level chamber component estimates.

In one embodiment, the second output includes a profile map of a condition of the substrate during processing (e.g., a temperature map of the substrate during processing). Alternatively, such a profile map of the condition of the substrate during processing may have already been generated at block 924 without the use of machine learning (and may have been input into the trained machine learning model).

In some instances, the second output of the trained machine learning model includes information about conditions of one or more chamber components. The information may include information about one or multiple parts of a chamber component in some embodiments. In embodiments, the output may include estimated mesa conditions, lift pin location conditions, seal band conditions and/or delamination conditions for an electrostatic chuck or other substrate support.

At block 930, processing logic compares at least one of a) the second profile map to the first profile map or b) the second machine learning output to the first machine learning output. Based on the comparison, processing logic may determine a change to one or more chamber components over time and/or a rate of change of the one or more chamber components. In some embodiments, multiple additional substrates are processed at other times, the substrates are measured, profile maps of the additional substrates are generated, and the profile maps are processed by the trained machine learning model to generate additional outputs prior to processing of the second substrate. The second outputs and/or profile maps may be compared to the additional outputs and/or profile maps as well as the first output and/or profile map. This provides additional data points, from which changes in erosion rate, drift, wear rate, and/or other chamber component conditions over time may be determined. For example, processing logic may determine whether a wear rate on one or more mesas is accelerating.

At block 932, processing logic makes one or more determinations about the chamber component(s) of the process chamber based on the comparison(s) made at block 930. The determinations may include, for example, one or more of erosion rates of one or more chamber components (block 920), changes in erosion rates of one or more chamber components (block 922), whether it is time to replace any chamber components (block 924), a remaining life of one or more chamber components (block 926), an anticipated yield of a device to be produced from the second substrate (block 928) and/or future substrates processed using the process chamber, and so on.

In an example, a substrate support may be replaced when a thickness of a seal band reaches a certain threshold value. Based on the comparison performed at block 932, processing logic may determine how quickly the seal band on the substrate support is eroding. The erosion rate may be applied to the currently determined thickness of the seal band to extrapolate into the future an age of the substrate support or time at which the seal band thickness will be equal to or less than the threshold thickness. The process chamber may then be scheduled for maintenance to have the substrate support replaced at the determined further age of the substrate support or time at which the seal band thickness is predicted to be equal to or less than the threshold thickness.

Figure 10:
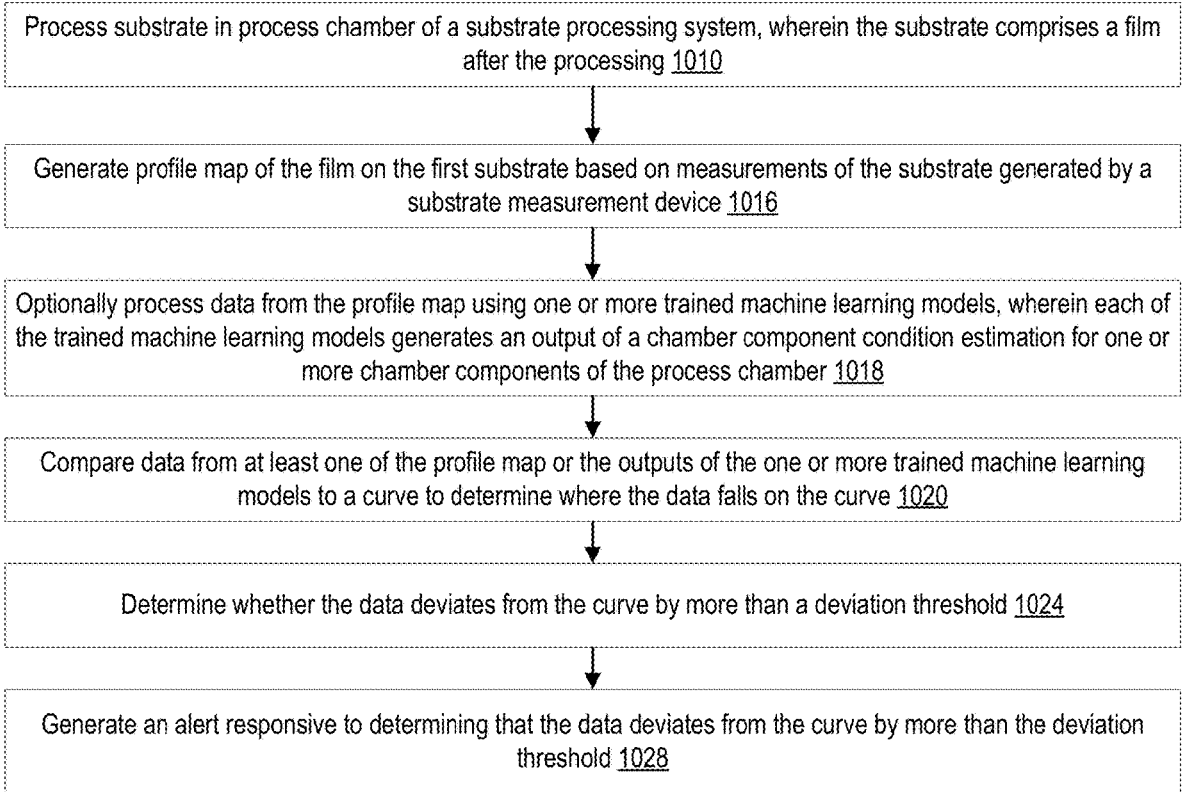
FIG. 10 is a flow diagram for a method of determining chamber conditions of one or more chamber components based on comparison of data to a curve, according to aspects of the present disclosure.

FIG. 10 is a flow diagram for a method 1000 of determining conditions of one or more chamber components based on comparison of data to a curve, according to aspects of the present disclosure. Method 1000 is performed by processing logic that can include hardware (circuitry, dedicated logic, etc.), software (such as is run on a general purpose computer system or a dedicated machine), firmware, or some combination thereof. In one implementation, method 1000 can be performed by a computer system, such as computer system architecture 100 of FIG. 1. In other or similar implementations, one or more operations of method 900 can be performed by one or more other machines not depicted in the figures. In some aspects, one or more operations of method 1000 can be performed by chamber component condition engine 330 of server machine 320, described with respect to FIG. 3.

At block 1010 of method 1000, a process chamber of a substrate processing system processes a substrate at a first time according to a process recipe. Processing logic may determine an age of a chamber component at the first time. The age may be measured in strict time in use (e.g., 100 days in active use, or 1000 hours of use processing substrates), as a number of substrates or lots (groups of substrates processed together) processed, or using other metrics. Age may be determined for a single chamber component of interest (e.g., substrate support or electrostatic chuck), or for multiple chamber components (e.g., substrate support and process kit ring).

At block 1016, a substrate measurement system may generate measurements of many locations on a surface of the substrate, and one or more first profile maps of the substrate may be generated from the multiple measurements. The first profile map(s) may be or include, for example, a first thickness map, a first particle map, a first temperature map, a first dielectric constant map, a first optical constant map, a first roughness map, and so on.

At block 1018, a computing device may process the first profile map or maps using one or more trained machine learning models. Each of the trained machine learning models outputs one or more first chamber component condition estimation for one or more chamber components of the process chamber. The output may include image-level or component-level chamber component estimates. In one embodiment, the output includes a profile map of a condition of the substrate during processing (e.g., a temperature map of the substrate during processing). Alternatively, such a profile map of the condition of the substrate during processing may have already been generated at block 1016 without the use of machine learning (and may have been input into the trained machine learning model).

In some instances, the output of the trained machine learning model includes information about conditions of one or more chamber components. The information may include information about one or multiple parts of a chamber component in some embodiments. In embodiments, the output may include estimated mesa conditions, lift pin location conditions, seal band conditions and/or delamination conditions for an electrostatic chuck or other substrate support. The output may additionally or alternatively include estimated process kit ring conditions, showerhead conditions, and so on.

At block 1020, processing logic compares at least one of the profile map or the outputs of the trained machine learning model(s) to a curve to determine where the data falls on the curve. The curve may have been generated based on measurements and/or machine learning model outputs of substrates processed by an ideal or golden process chamber over time, or may have been generated based on measurements and/or machine learning model outputs of substrates processed multiple process chambers of a same type and/or running a same recipe over time. The curve may indicate for any given age of a chamber component of a process chamber of that type and/or running that recipe, a range of expected chamber component conditions for the chamber component. The curve may include a single value with an upper and/or lower deviation threshold (e.g., a standard deviation) for each age value.

At block 1024, based on the comparison, processing logic may determine whether the data deviates from the curve by more than a deviation threshold (e.g., is outside of the upper or lower deviation threshold). At block 1028, processing logic may generate an alert responsive to determining that the data deviates from the curve by more than the deviation threshold. In embodiments, processing logic may plot the current chamber component condition values against the curve on a display to show to a user how the chamber component compares to the curve.

In embodiments, method 1000 may be performed periodically for substrates processed by a process chamber, and the results may be plotted against the curve. This can show to a user how the chamber component conditions are changing over time as compared to how the chamber component conditions are expected to change over time. If, for example, a particular side of a process kit ring and/or electrostatic chuck are eroding at a faster than expected rate, this may be an indication that these components are out of alignment.

Figure 11A:
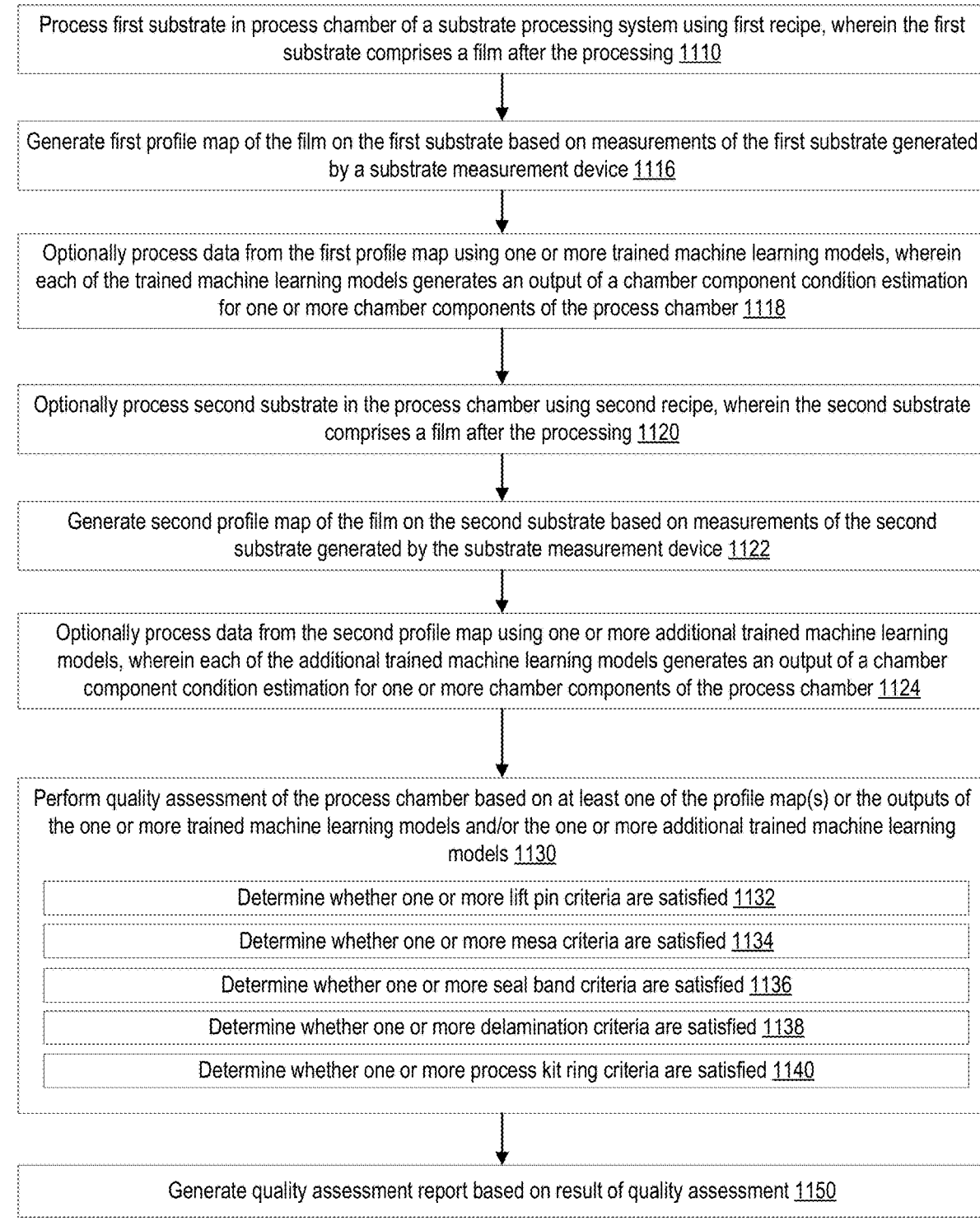
FIG. 11A is a flow diagram for a method of performing a quality assessment of a process chamber, according to aspects of the present disclosure.

FIG. 11A is a flow diagram for a method 1100 of performing a quality assessment of a process chamber, according to aspects of the present disclosure. Method 1100 is performed by processing logic that can include hardware (circuitry, dedicated logic, etc.), software (such as is run on a general purpose computer system or a dedicated machine), firmware, or some combination thereof. In one implementation, method 1100 can be performed by a computer system, such as computer system architecture 100 of FIG. 1. In other or similar implementations, one or more operations of method 1100 can be performed by one or more other machines not depicted in the figures. In some aspects, one or more operations of method 1100 can be performed by chamber component condition engine 330 of server machine 320, described with respect to FIG. 3.

At block 1110 of method 1100, a process chamber of a substrate processing system processes a first substrate according to a first process recipe. The first process recipe may be designed to maximize variation in a film property to be measured at block 1116 based on variation in a first chamber component condition during processing (e.g., RF field, temperature, etc.).

At block 1116, a substrate measurement system may generate measurements of many locations on a surface of the substrate, and one or more first profile maps of the substrate may be generated from the multiple measurements. The first profile map(s) may be or include, for example, a first thickness map, a first particle map, a first temperature map, a first dielectric constant map, a first optical constant map, a first roughness map, and so on.

At block 1118, a computing device may process the first profile map or maps using one or more trained machine learning models. Each of the trained machine learning models outputs one or more first chamber component condition estimation for one or more chamber components of the process chamber. The first output may include image-level or component-level chamber component estimates. In one embodiment, the first output includes information about first conditions of one or more chamber components. The information may include information about one or multiple parts of a chamber component in some embodiments.

At block 1120, the process chamber of the substrate processing system optionally processes a second substrate according a second process recipe. The second process recipe may be designed to maximize variation in a film property to be measured at block 1122 based on variation in a second chamber component condition during processing (e.g., RF field, temperature, etc.).

At block 1122, the substrate measurement system may generate measurements of many locations on a surface of the second substrate, and one or more second profile maps of the second substrate may be generated from the multiple measurements. The second profile map(s) may be or include, for example, a second thickness map, a second particle map, a second temperature map, a second dielectric constant map, a second optical constant map, a second roughness map, and so on.

At block 1124, the computing device may process the second profile map or maps using one or more additional trained machine learning models (which may be different from the machine learning models used at block 1118). Each of the additional trained machine learning models outputs one or more second chamber component condition estimation for one or more chamber components of the process chamber. The second output may include image-level or component-level chamber component estimates. In an example, the first recipe used to process the first substrate may generate a film that is sensitive to temperature fluctuations, which may in turn be used to determine lift pin hot spots, delamination of an electrostatic chuck, mesa erosion, missing mesas, and/or seal band erosion. The second recipe used to process the second substrate may generate film that is sensitive to RF field fluctuations and/or plasma fluctuations, and may be used to determine process kit ring placement and/or process kit ring erosion.

At block 1130, processing logic performs a quality assessment of the process chamber based on at least one of the profile map(s) or the outputs of the one or more trained machine learning models and/or the one or more additional trained machine learning models. Performing the quality assessment may include running a number of tests on the chamber component condition estimations and/or comparing the chamber component estimations to a number of criteria. Different criteria may be associated with different chamber component condition tests.

In one embodiment, at block 1132 processing logic determines whether one or more lift pin criteria are satisfied. The lift pin criteria may include detected temperatures at lift pin locations that are below a temperature threshold. In one embodiment, at block 1134 processing logic determines whether one or more mesa criteria are satisfied. The mesa criteria may not be satisfied, for example, if missing mesas are identified, and/or there is detection of mesas with an amount of erosion that is greater than an erosion threshold, and/or there is detection of a threshold number of mesas with an amount of erosion that is greater than an erosion threshold (e.g., a thickness that is less than a thickness threshold). In one embodiment, at block 1136 processing logic determines whether one or more seal band criteria are satisfied. The seal band criteria may not be satisfied if there is detection of chips or cracks in the seal band, and/or there is detection of locations on the seal band with an amount of erosion that is greater than an erosion threshold (e.g., a thickness that is less than a thickness threshold). In one embodiment, at block 1138 processing logic determines whether one or more delamination criteria are satisfied. The delamination criteria may not be satisfied if there is detection of areas of delamination between plates or layers of a substrate support or electrostatic chuck. In one embodiment, at block 1140 processing logic determines whether one or more process kit ring criteria are satisfied. The process kit ring criteria may not be satisfied if the process kit ring is not centered around the substrate support (e.g., the process kit ring is offset from center by more than a threshold), or if a threshold amount of erosion is detected for the process kit ring.

At block 1150, processing logic generates a quality assessment report based on a result of the quality assessment performed at block 1130. The quality assessment report may indicate which criteria whether or not a process chamber passed a quality assessment and/or whether or not any particular chamber components in the process chamber passed a quality assessment. If any chamber component failed to satisfy quality assessment, processing logic may output an indication of why the quality assessment failed for that chamber component (e.g., which criteria were not satisfied) and/or a degree to which the chamber component failed to satisfy the criteria.

Method 1100 may be performed periodically and/or after a maintenance event as part of a requalification procedure in embodiments. If all tests and/or criteria of the quality assessment are passed successfully, then requalification of a process chamber may be confirmed.

Figure 11B:
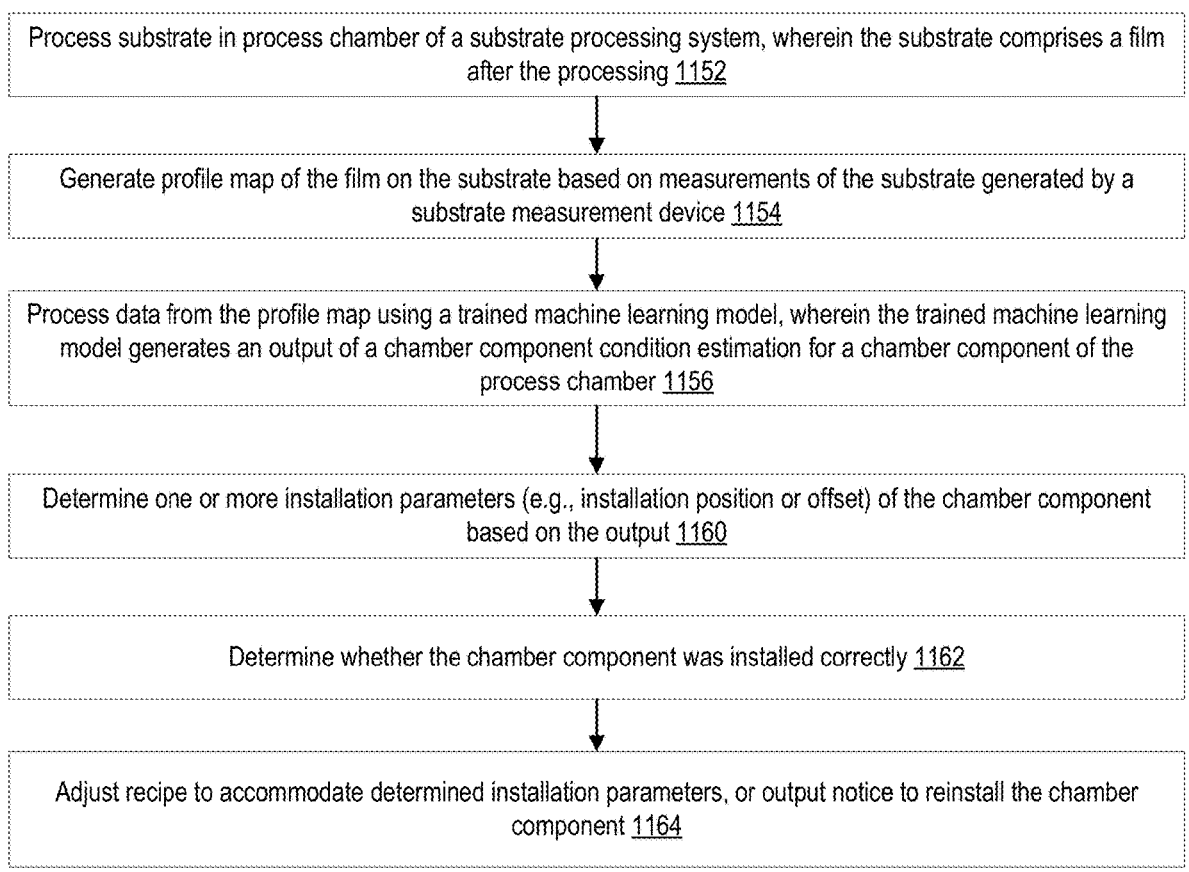
FIG. 11B is a flow diagram for a method of determining how a chamber component was installed in a process chamber, according to aspects of the present disclosure.

FIG. 11B is a flow diagram for a method 1150 of determining how a chamber component was installed in a process chamber, according to aspects of the present disclosure. Method 1150 is performed by processing logic that can include hardware (circuitry, dedicated logic, etc.), software (such as is run on a general purpose computer system or a dedicated machine), firmware, or some combination thereof. In one implementation, method 1150 can be performed by a computer system, such as computer system architecture 100 of FIG. 1. In other or similar implementations, one or more operations of method 1150 can be performed by one or more other machines not depicted in the figures. In some aspects, one or more operations of method 1150 can be performed by chamber component condition engine 330 of server machine 320, described with respect to FIG. 3.

At block 1152 of method 1150, a process chamber of a substrate processing system processes a substrate in a process chamber according to a first process recipe.

At block 1154, a substrate measurement system may generate measurements of many locations on a surface of the substrate, and one or more first profile maps of the substrate may be generated from the multiple measurements. The first profile map(s) may be or include, for example, a first thickness map, a first particle map, a first temperature map, a first dielectric constant map, a first optical constant map, a first roughness map, and so on.

At block 1156, a computing device may process the first profile map or maps using one or more trained machine learning models. Each of the trained machine learning models outputs one or more chamber component condition estimation for one or more chamber components of the process chamber. The output may include image-level or component-level chamber component estimates. The output may include information about one or multiple parts of a chamber component in some embodiments.

At block 1160, processing logic determines one or more installation parameters of the chamber component based on the output. In some instances, the output of the machine learning model indicates a position or location of an installation (e.g., such as an offset of a process kit ring from a center of an electrostatic chuck around which the process kit ring has been placed). Other installation parameters that may be detected include, for example, a degree to which one or more attachments or bolts have been tightened.

At block 1162, processing logic may determine whether the chamber component was installed correctly based on the determined installation parameters for the chamber component. In an example, process kit ring criteria may include a threshold offset from center. If the process kit ring has an offset that is greater than the threshold offset, then a determination may be made that the process kit ring was not installed correctly.

At block 1164, processing logic may adjust a recipe for future process runs to accommodate the determined installation parameters. For example, an RF field and/or temperatures may be adjusted at one or more region of a substrate support based on an offset of a process kit ring. Additionally, or alternatively, processing logic may output a notice to reinstall the chamber component. In some embodiments, processing logic automatically schedules maintenance for the process chamber. In some instances, the process chamber may already be offline for maintenance, and method 1150 may be performed as part of a qualification procedure. If the chamber component was not installed correctly, then further maintenance may be performed (e.g., such as by reinstalling the chamber component) before the process chamber can be requalified.

Figure 12:
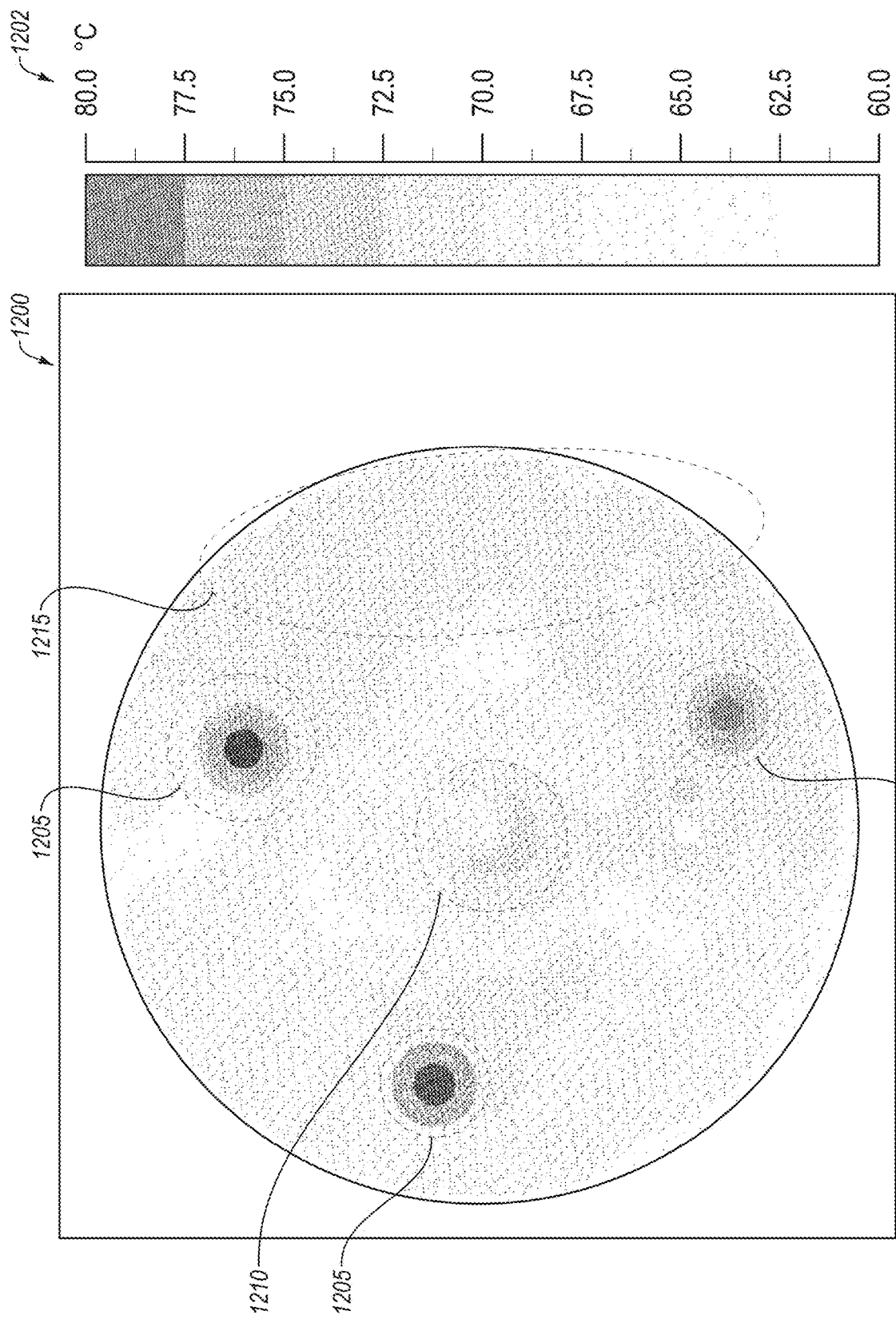
FIG. 12 is a profile map (e.g., a heat map) of a processed substrate, according to aspects of the present disclosure.

FIG. 12 is a profile map 1200 of a processed substrate, according to aspects of the present disclosure. The profile map 1200 is a heat map that shows temperatures of different locations on the substrate during processing in a process chamber. The temperatures may be based on thicknesses at the different locations of a film deposited or etched during the processing. A key 1202 is provided to show how to interpret the profile map 1200. As shown, hot spots 1205 are provided at each lift pin location, where the hot spots had elevated temperatures during processing. Also shown, there was a hot spot 1210 at around the center of the substrate. Additionally, a region 1215 at a right side of the substrate was warmer than other regions around the substrate, which could indicate, for example, delamination at the right side of a substrate support.

Figure 13:
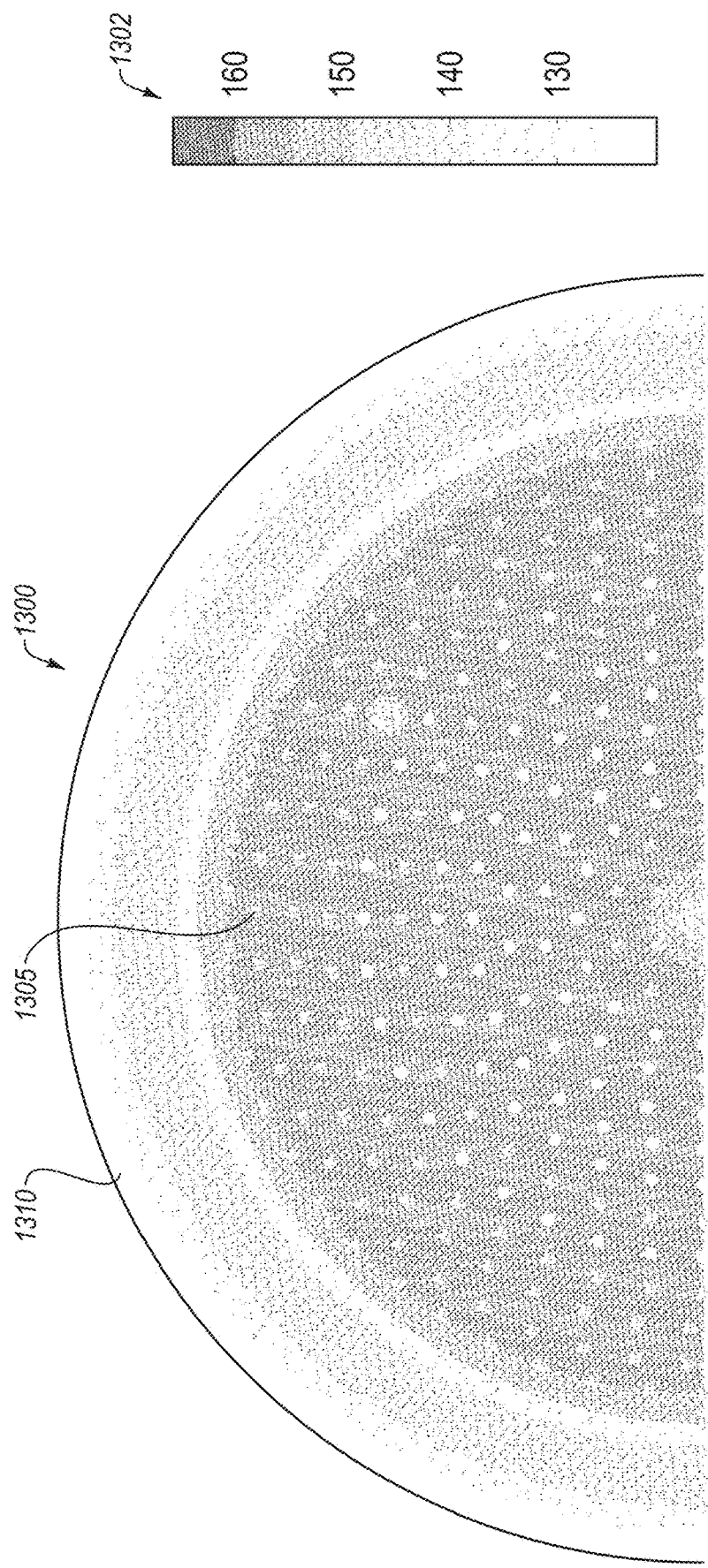
FIG. 13 is a profile map (e.g., a heat map) of portion of a processed substrate, according to aspects of the present disclosure.

FIG. 13 is a profile map 1300 of portion of a processed substrate, according to aspects of the present disclosure. The profile map 1300 is a heat map that shows temperatures of different locations on the substrate during processing in a process chamber. The temperatures may be based on thicknesses at the different locations of a film deposited or etched during the processing. Note that other profile maps may represent properties other than heat, such as RF field strength, plasma strength or quantity, film thickness, and so on. A key 1302 is provided to show how to interpret the profile map 1300. As shown, a region around a perimeter of the substrate 1310 was much cooler during processing than a remainder of the substrate. Additionally, many localized spots of reduced temperature 1305 are shown, each of which represents a mesa of a substrate support. Points at which a mesa contacted the substrate may have had improved thermal contact, and thus may have a lower temperature due to cooling by the substrate support during processing. Based on such a profile map, processing logic may determine whether any mesas are missing (e.g., based on identification of a lack of a localized cool spot where one is expected). Such information may be extracted by an image processing algorithm or trained machine learning model to determine, for example, whether any mesas are missing from an electrostatic chuck.

Figure 14:
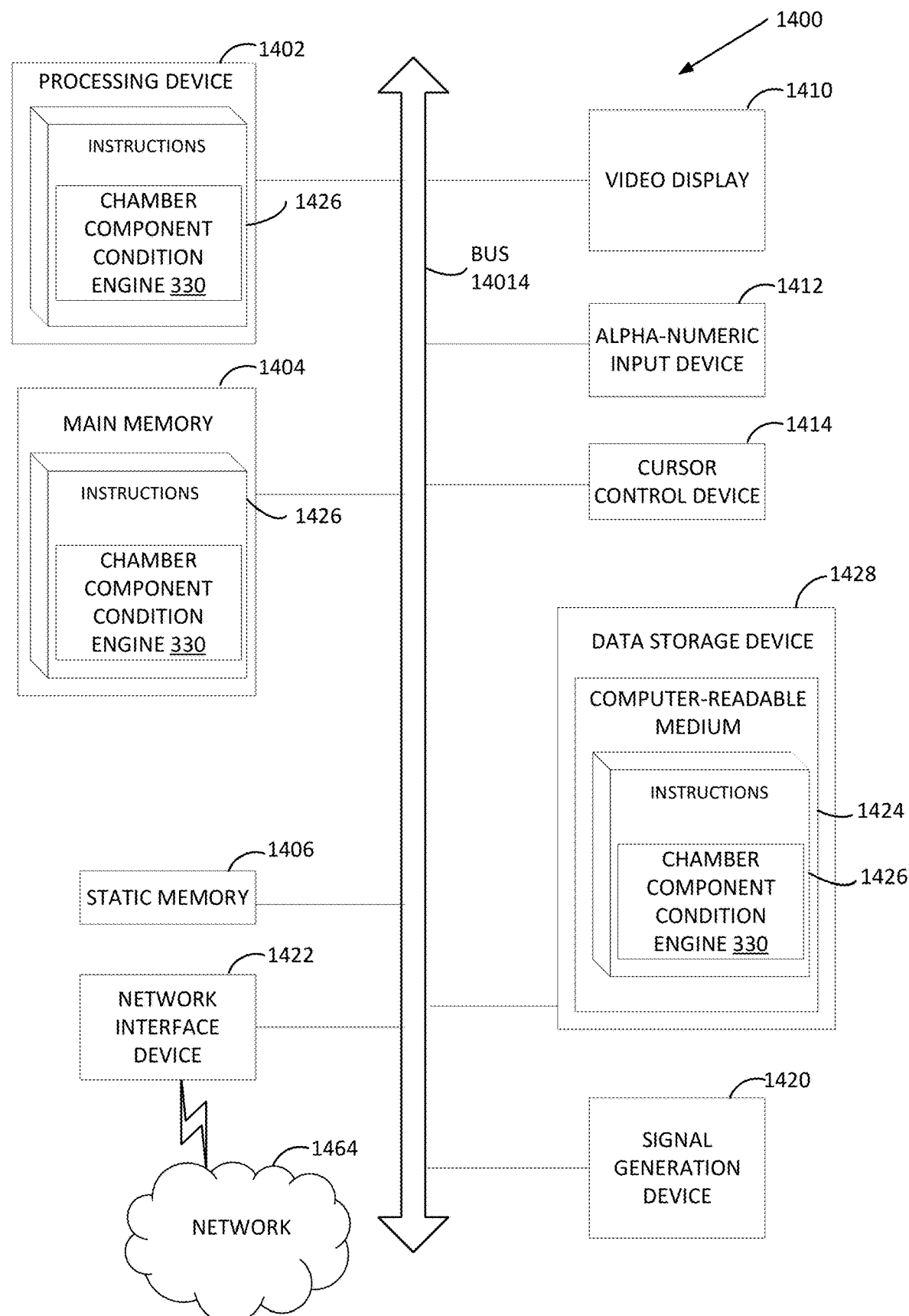
FIG. 14 depicts a diagrammatic representation of a machine in the example form of a computing device within which a set of instructions, for causing the machine to perform any one or more of the methodologies discussed herein, can be executed.

FIG. 14 depicts a diagrammatic representation of a machine in the example form of a computing device 1400 within which a set of instructions, for causing the machine to perform any one or more of the methodologies discussed herein, can be executed. In alternative embodiments, the machine can be connected (e.g., networked) to other machines in a Local Area Network (LAN), an intranet, an extranet, or the Internet. The machine can operate in the capacity of a server or a client machine in a client-server network environment, or as a peer machine in a peer-to-peer (or distributed) network environment. The machine can be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In embodiments, computing device 1400 can correspond to one or more of server machine 170, server machine 180, predictive server 112, system controller 228, server machine 320, or server machine 350, as described herein.

The example computing device 1400 includes a processing device 1402, a main memory 1404 (e.g., read-only memory (ROM), flash memory, dynamic random access memory (DRAM) such as synchronous DRAM (SDRAM), etc.), a static memory 1406 (e.g., flash memory, static random access memory (SRAM), etc.), and a secondary memory (e.g., a data storage device 1428), which communicate with each other via a bus 1408.

Processing device 1402 can represent one or more general-purpose processors such as a microprocessor, central processing unit, or the like. More particularly, the processing device 1402 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1402 can also be one or more special-purpose processing devices such as an application specific integrated circuit (ASIC), a field programmable gate array (FPGA), a digital signal processor (DSP), network processor, or the like. Processing device 1402 can also be or include a system on a chip (SoC), programmable logic controller (PLC), or other type of processing device. Processing device 1402 is configured to execute the processing logic for performing operations and steps discussed herein.

The computing device 1400 can further include a network interface device 1422 for communicating with a network 1464. The computing device 1400 also can include a video display unit 1410 (e.g., a liquid crystal display (LCD) or a cathode ray tube (CRT)), an alphanumeric input device 1412 (e.g., a keyboard), a cursor control device 1414 (e.g., a mouse), and a signal generation device 1420 (e.g., a speaker).

The data storage device 1428 can include a machine-readable storage medium (or more specifically a non-transitory computer-readable storage medium) 1424 on which is stored one or more sets of instructions 1426 embodying any one or more of the methodologies or functions described herein. For example, instructions 1426 may include instructions for chamber component condition engine 330. A non-transitory storage medium refers to a storage medium other than a carrier wave. The instructions 1426 can also reside, completely or at least partially, within the main memory 1404 and/or within the processing device 1402 during execution thereof by the computer device 1400, the main memory 1404 and the processing device 1402 also constituting computer-readable storage media.

While the computer-readable storage medium 1424 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth in order to provide a good understanding of several embodiments of the present disclosure. It will be apparent to one skilled in the art, however, that at least some embodiments of the present disclosure can be practiced without these specific details. In other instances, well-known components or methods are not described in detail or are presented in simple block diagram format in order to avoid unnecessarily obscuring the present disclosure. Thus, the specific details set forth are merely exemplary. Particular implementations can vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of operations of each method can be altered so that certain operations can be performed in an inverse order so that certain operations can be performed, at least in part, concurrently with other operations. In another embodiment, instructions or sub-operations of distinct operations can be in an intermittent and/or alternating manner.

It is understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method, comprising:
    processing a first substrate in a process chamber of a substrate processing system according to a recipe, wherein the first substrate comprises at least one of a film or a feature after the processing;
    generating a profile map of at least one of the film or the feature on the first substrate using a substrate measurement system of the substrate processing system;
    processing data from the profile map using a first model, wherein the first model outputs at least one of an estimated mesa condition of a substrate support for the process chamber, an estimated lift pin location condition of the substrate support an estimated seal band condition of the substrate support, or an estimated process kit ring condition for a process kit ring for the process chamber;
    determining at least one of a) a quality of the substrate support based on at least one of the estimated mesa condition, the estimated lift pin location condition, or the estimated seal band condition or b) a quality of the process kit ring based on the estimated process kit ring condition;
    outputting a notice of at least one of the estimated mesa condition, the estimated lift pin location condition, the estimated process kit ring condition, or the estimated seal band condition of the substrate support as a result of the processing; and causing maintenance to be performed on at least one of a) the substrate support based at least in part on the quality of the substrate support or b) the process kit ring based at least in part on the quality of the process kit ring.

2. The method of claim 1, further comprising:
determining whether to perform maintenance on the substrate support based at least in part on at least one of the estimated mesa condition, the estimated lift pin location condition or the estimated seal band condition.

3. The method of claim 1, wherein the first model outputs the estimated mesa condition, and wherein the estimated mesa condition comprises at least one of an estimation of an amount of erosion for one or more mesas of the substrate support, an estimation of missing mesas, an estimation of a mesa pattern, or an estimation of a degree to which the estimated mesa pattern deviates from a target mesa pattern.

4. The method of claim 1, wherein the first model outputs the estimated seal band condition, and wherein the estimated seal band condition comprises at least one of an estimation of erosion for one or more portions of a seal band of the substrate support or an estimation of a concentricity of the seal band.

5. The method of claim 1, wherein the first model outputs the estimated lift pin location condition, and wherein the estimated lift pin location condition comprises at least one of an estimation of hot spots at one or more locations of the substrate support, an estimation of lift pin locations, or an estimation of a deviation of the estimated lift pin locations from target lift pin locations.

6. The method of claim 1, wherein the first model outputs the estimated process kit ring condition for the process kit ring that at least one of a) surrounds the substrate support or b) is underneath the substrate support, wherein the estimated process kit ring condition comprises at least one of an estimation of erosion for the process kit ring, an estimation of a defect in the process kit ring, or an estimation of a missing process kit ring.

7. The method of claim 1, further comprising:
processing a second substrate in the process chamber, wherein the second substrate comprises at least one of a second film or a second feature after the processing;
generating a second profile map of at least one of the second film or the second feature on the second substrate using the substrate measurement system of the substrate processing system;
processing data from the second profile map using the first model, wherein the first model outputs at least one of a second estimated mesa condition of the substrate support, a second estimated lift pin location condition of the substrate support, a second estimated seal band condition of the substrate support, or a second estimated process kit ring condition of the process kit ring; and
comparing at least one of a) the second estimated mesa condition to the estimated mesa condition, b) the second estimated lift pin location condition to the estimated lift pin location condition, c) the second estimated seal band condition to the estimated seal band condition, or d) the second estimated process kit ring condition to the estimated process kit ring condition.

8. The method of claim 7, further comprising:
determining an erosion rate for at least one of a) one or more mesas of the substrate support, b) one or more lift pin locations of the substrate support, c) one or more seal band portions of the substrate support, or d) the process kit ring based on a result of the comparing.

9. The method of claim 7, further comprising determining at least one of the following based on a result of the comparing:
a) whether it is time to replace a chamber component of the process chamber;
b) a remaining life of the chamber component; or
c) an anticipated yield performance of a device produced from the second substrate.

10. The method of claim 1, further comprising:
determining that one or more mesas are broken, missing or improperly positioned based on the estimated mesa condition; and
determining that the substrate support fails to pass a quality test in view of the one or more mesas that are broken, missing or improperly positioned.

11. The method of claim 1, further comprising:
determining at least one of a) when to replace the process kit ring based on the estimated process kit ring condition, or b) a placement position of the process kit ring around the substrate support.

12. The method of claim 1, wherein the substrate support comprises a first component, a second component, and a bond between the first component and the second component, and wherein the first model or a second model outputs a bond condition estimation for the bond that indicates a degree of failure of the bond and whether delamination of the second component from the first component has occurred.

13. The method of claim 1, wherein the profile map of the film comprises a thickness profile map of the film.

14. The method of claim 1, further comprising:
determining a probability that the substrate support will cause a reduction in product quality based on at least one of the estimated mesa condition, the estimated lift pin location condition or the estimated seal band condition of the substrate support; and
determining whether to perform maintenance on the substrate support based on the probability that the substrate support will cause the reduction in the product quality.

15. The method of claim 1, further comprising:
estimating a time of failure of the substrate support based at least in part on at least one of the estimated mesa condition, the estimated lift pin location condition, the estimated seal band condition, or the estimated process kit ring condition; and
determining when to perform maintenance on at least one of the substrate support or the process kit ring based on the estimated time of failure.

16. The method of claim 1, wherein the first model is a first trained machine learning model, the method further comprising:
training a first machine learning model to produce the first trained machine learning model, wherein the first machine learning model is trained using data from a plurality of process chambers that share a common process chamber type.

17. The method of claim 1, wherein the first model is a first trained machine learning model, the method further comprising:
tuning the first trained machine learning model using additional data from the process chamber prior to processing the data from the profile map.

18. The method of claim 1, further comprising:
generating one or more image of the first substrate using an imaging device; and
inputting the one or more image into the first model along with the profile map.

19. The method of claim 1, further comprising:
determining one or more adjustments to at least one of a process recipe or tool parameter setting to compensate for at least one of the estimated mesa condition, the estimated lift pin location condition, the estimated seal band condition, or the estimated process kit ring condition.

20. The method of claim 1, wherein at least one of the substrate support or the process kit ring is a new component that has not yet been used to process product substrates.

21. A non-trajectory computer readable medium comprising instructions that, when executed by a processing device, cause the processing device to perform operations comprising:
receiving a profile map of at least one of a film or a feature on a first substrate that was measured using a substrate measurement system after the first substrate was processed in a process chamber;
processing data from the profile map using a first trained machine learning model, wherein the first trained machine learning model outputs at least one of an estimated mesa condition of a substrate support for the process chamber, an estimated lift pin location condition of the substrate support an estimated seal band condition of the substrate support, or an estimated process kit ring condition for a process kit ring for the process chamber;
determining at least one of a) a quality of the substrate support based on at least one of the estimated mesa condition, the estimated lift pin location condition, or the estimated seal band condition or b) a quality of the process kit ring based on the estimated process kit ring condition;
outputting a notice of at least one of the estimated mesa condition, the estimated lift pin location condition, the estimated process kit ring condition, or the estimated seal band condition of the substrate support as a result of the processing; and
causing maintenance to be performed on at least one of a) the substrate support based at least in part on the quality of the substrate support or b) the process kit ring based at least in part on the quality of the process kit ring.

22. The non-trajectory computer readable medium of claim 21, the operations further comprising:
determining whether to perform maintenance on the substrate support based at least in part on at least one of the estimated mesa condition, the estimated lift pin location condition, the estimated seal band condition, or the estimated process kit ring condition.

23. The non-trajectory computer readable medium of claim 21, the operations further comprising:
determining one or more adjustments to a process recipe to compensate for at least one of the estimated mesa condition, the estimated lift pin location condition, the estimated seal band condition, or the estimated process kit ring condition.

24. A non-trajectory computer readable medium comprising instructions that, when executed by a processing device, cause the processing device to perform operations comprising:
receiving a first profile map of at least one of a film or a feature on a first substrate, the first profile map having been generated by a substrate measurement system after the first substrate was processed by a process chamber according to a recipe at a first time;
receiving a second profile map of at least one of a film or a feature on a second substrate, the second profile map having been generated by the substrate measurement system after the second substrate was processed by the process chamber according to the recipe at a second time;
comparing the second profile map to the first profile map;
determining, based on a result of the comparing, at least one of a) an estimated mesa condition for one or more mesas of a substrate support in the process chamber, b) an estimated lift pin location condition of one or more lift pins of the substrate support, or c) an estimated seal band condition of a seal band of the substrate support;
determining a quality of the substrate support based on at least one of the estimated mesa condition, the estimated lift pin location condition, or the estimated seal band condition; and
causing maintenance to be performed on the substrate support based at least in part on the quality of the substrate support.

* * * * *